(12) United States Patent
Kwon

(10) Patent No.: US 12,315,824 B2
(45) Date of Patent: May 27, 2025

(54) SEMICONDUCTOR PACKAGE

(71) Applicant: Samsung Electronics Co., Ltd., Suwon-si (KR)

(72) Inventor: Yonghwan Kwon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 471 days.

(21) Appl. No.: 17/680,410

(22) Filed: Feb. 25, 2022

(65) Prior Publication Data
US 2023/0023672 A1 Jan. 26, 2023

(30) Foreign Application Priority Data
Jul. 23, 2021 (KR) .................. 10-2021-0097025

(51) Int. Cl.
*H01L 23/00* (2006.01)
*H01L 23/31* (2006.01)
*H01L 23/498* (2006.01)

(52) U.S. Cl.
CPC ........ *H01L 23/562* (2013.01); *H01L 23/3121* (2013.01); *H01L 23/49822* (2013.01); *H01L 24/05* (2013.01)

(58) Field of Classification Search
None
See application file for complete search history.

(56) References Cited

U.S. PATENT DOCUMENTS

| | | | |
|---|---|---|---|
| 7,663,201 B2 | 2/2010 | Yamada | |
| 8,017,515 B2 | 9/2011 | Marimuthu et al. | |
| 8,035,226 B1 | 10/2011 | Wilcoxen et al. | |
| 8,569,886 B2 | 10/2013 | Tu et al. | |
| 8,618,658 B1 * | 12/2013 | Paek | H01L 24/05 257/737 |
| 8,642,469 B2 | 2/2014 | Choi et al. | |
| 9,548,240 B2 | 1/2017 | Lin et al. | |
| 2013/0009286 A1 * | 1/2013 | Kim | H01L 24/03 257/632 |

FOREIGN PATENT DOCUMENTS

| | | |
|---|---|---|
| JP | 2013051268 A | 3/2013 |
| KR | 100618700 B1 | 9/2006 |
| KR | 101121827 B1 | 3/2012 |

* cited by examiner

*Primary Examiner* — Long Pham
(74) *Attorney, Agent, or Firm* — Muir Patent Law, PLLC

(57) ABSTRACT

Disclosed is a semiconductor package comprising a semiconductor chip, a redistribution pattern on a bottom surface of the semiconductor chip and coupled to the semiconductor chip, a protection layer that covers a bottom surface of the redistribution pattern, a conductive pattern on a bottom surface of the protection layer and coupled to the redistribution pattern, a buffer pattern in contact with a bottom surface of a first part of the conductive pattern and with the bottom surface of the protection layer, and an under bump pattern on a bottom surface of the second part of the conductive pattern and covering a bottom surface and a side surface of the buffer pattern. The under bump pattern is coupled to the second part of the conductive pattern.

20 Claims, 18 Drawing Sheets

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0097025 filed on Jul. 23, 2021 in the Korean Intellectual Property Office, the disclosure of which is hereby incorporated by reference in its entirety.

BACKGROUND

Aspects of the present inventive concepts relate to a semiconductor package, and more particularly, to a semiconductor package including a redistribution substrate and a method of fabricating the same.

A semiconductor package is provided to implement an integrated circuit chip in electronic products. A semiconductor package is typically configured such that a semiconductor chip is mounted on a printed circuit board and bonding wires or bumps are used to electrically connect the semiconductor chip to the printed circuit board. With the development of electronic industry, various research have been conducted to improve reliability and durability of semiconductor packages.

SUMMARY

Some embodiments of the present inventive concepts provide a semiconductor package with increased reliability and improved durability.

According to some embodiments of the present inventive concepts, a semiconductor package may comprise: a semiconductor chip; a redistribution pattern on a bottom surface of the semiconductor chip and coupled to the semiconductor chip; a protection layer that covers a bottom surface of the redistribution pattern; a conductive pattern on a bottom surface of the protection layer and coupled to the redistribution pattern; a buffer pattern in contact with a bottom surface of a first part of the conductive pattern and with the bottom surface of the protection layer, the buffer pattern being spaced apart from a second part of the conductive pattern; and an under bump pattern on a bottom surface of the second part of the conductive pattern, the under bump pattern covering a bottom surface and a side surface of the buffer pattern. The under bump pattern may be coupled to the second part of the conductive pattern.

According to some embodiments of the present inventive concepts, a semiconductor package may comprise: a semiconductor chip that includes a chip pad; a redistribution pattern on the semiconductor chip and coupled to the chip pad; a protection layer on the semiconductor chip and covering the redistribution pattern; a conductive pattern on the protection layer and coupled to the redistribution pattern; a buffer pattern that covers the protection layer and a first part of the conductive pattern; and an under bump pattern that covers the buffer pattern and a second part of the conductive pattern.

According to some embodiments of the present inventive concepts, a semiconductor package may comprise: a semiconductor chip that includes a chip pad; a redistribution substrate on a bottom surface of the semiconductor chip and including a dielectric layer, a seed pattern, and a redistribution pattern, the redistribution substrate being electrically connected to the chip pad; a protection layer that covers a bottom surface of the redistribution pattern; a conductive pattern on a bottom surface of the protection layer and electrically connected to the redistribution pattern, the conductive pattern including a via part on the bottom surface of the redistribution pattern and in the protection layer, a first line part on a bottom surface of the via part, and a second line part on the bottom surface of the protection layer and connected to the first line part; a dielectric buffer pattern in contact with the first line part of the conductive pattern and with the protection layer, the dielectric buffer pattern being spaced apart from the second line part of the conductive pattern; an under bump pattern that covers a bottom surface of the second line part of the conductive pattern, a bottom surface and a side surface of the dielectric buffer pattern, and the bottom surface of the protection layer; and a solder ball on a bottom surface of the under bump pattern. The under bump pattern may be coupled to the second line part of the conductive pattern.

DETAILED DESCRIPTION OF EMBODIMENTS

Figure 1A:
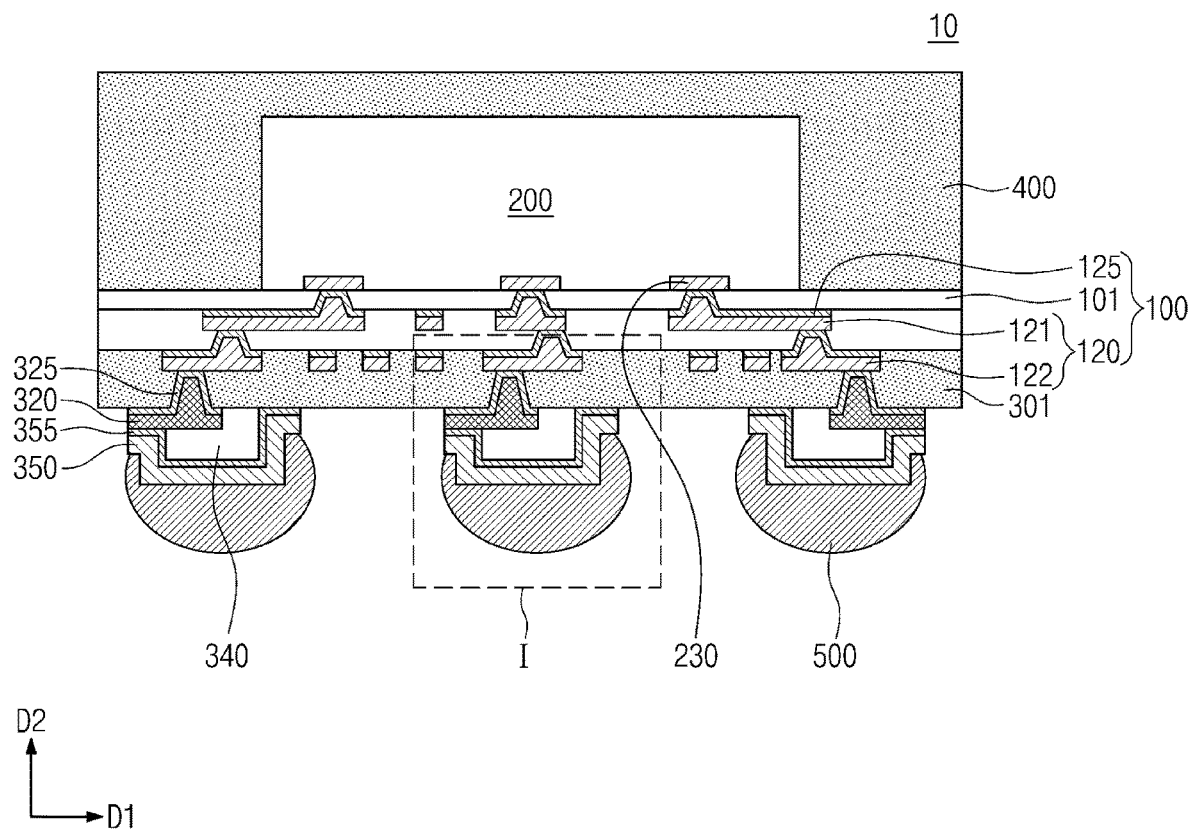
FIG. 1A illustrates a cross-sectional view showing a semiconductor package according to some embodiments.

In this description, like reference numerals may indicate like components. In this description, the phrase "a certain component is present on other component" may mean "the certain component is present at least one of top, bottom, and side surfaces of the other component." The following will now describe a semiconductor package and its fabrication method according to the present inventive concepts.

Figure 1B:
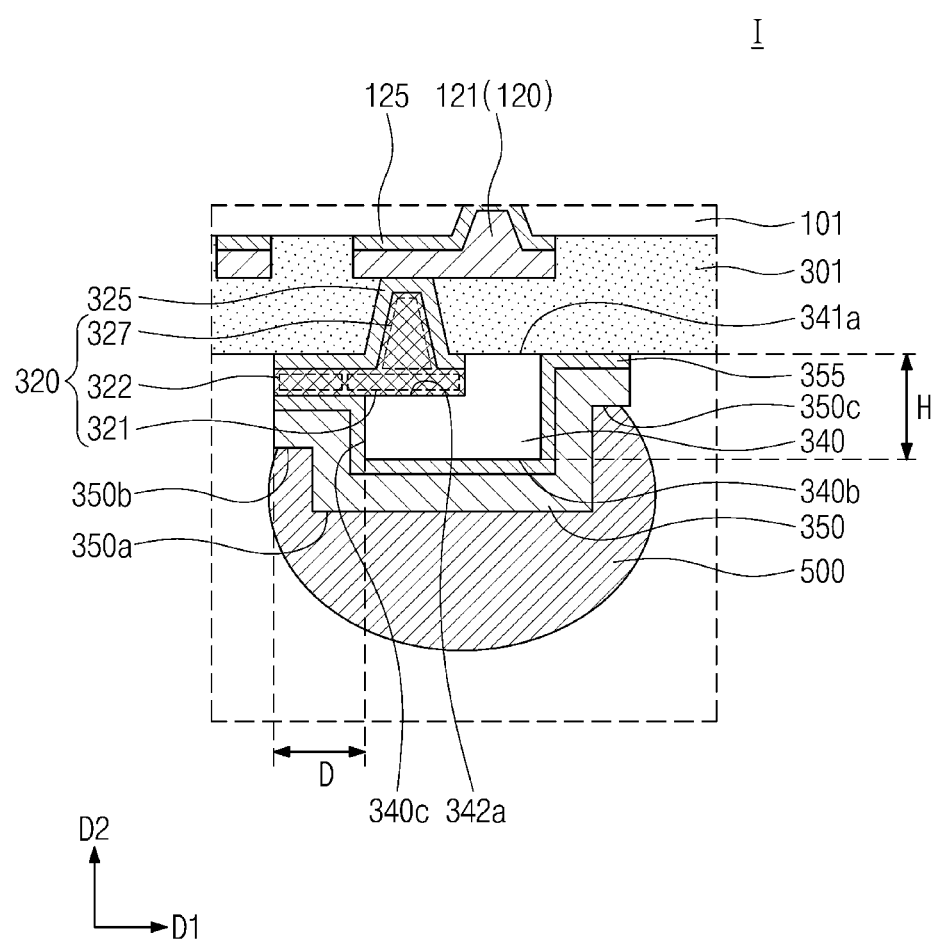
FIG. 1B illustrates an enlarged view showing section I of FIG. 1A.
Figure 1C:
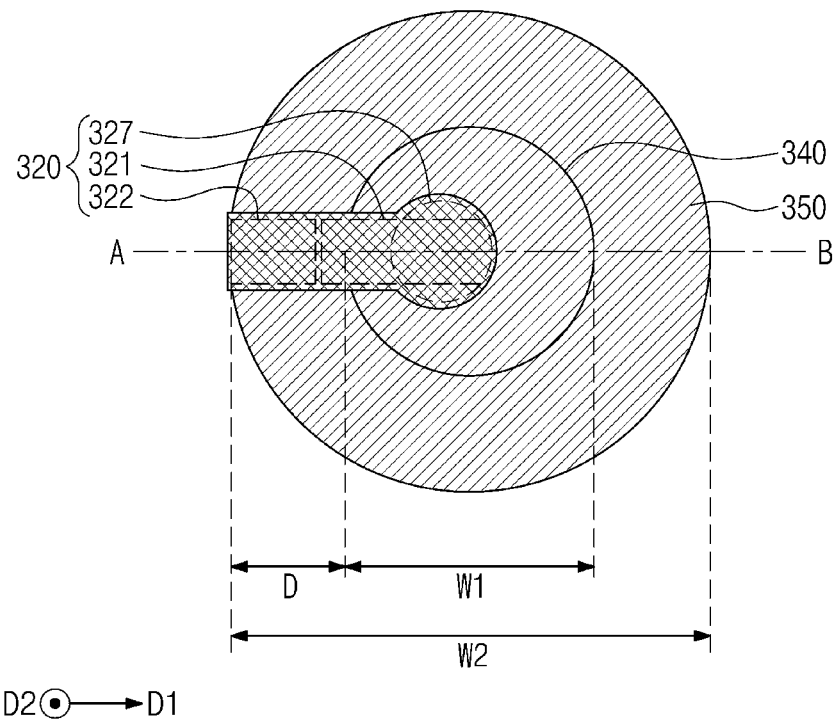
FIG. 1C illustrates a plan view showing a conductive pattern, a buffer pattern, and an under bump pattern according to some embodiments.
Figure 1D:
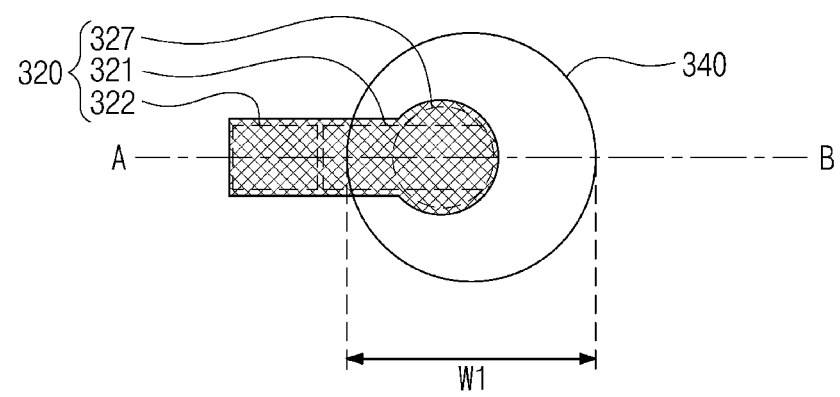
FIG. 1D illustrates a plan view showing a conductive pattern and a buffer pattern according to some embodiments.

FIG. 1A illustrates a cross-sectional view showing a semiconductor package according to some embodiments. FIG. 1B illustrates an enlarged view showing section I of FIG. 1B. FIG. 1C illustrates a plan view showing a conductive pattern, a buffer pattern, and an under bump pattern according to some embodiments. FIG. 1D illustrates a plan view showing a conductive pattern and a buffer pattern according to some embodiments. FIG. 1B corresponds to a cross-section taken along line A-B of FIG. 1C or 1D.

As illustrated in FIGS. 1A, 1B, 1C, and 1D, a semiconductor package 10 may include a first redistribution substrate 100, a semiconductor chip 200, a molding layer 400, a protection layer 301, a conductive pattern 320, a buffer pattern 340, an under bump pattern 350, and a solder ball 500.

The semiconductor chip 200 may be mounted on a top surface of the first redistribution substrate 100. When viewed in plan, the semiconductor chip 200 may be disposed on a central region of the first redistribution substrate 100. The semiconductor chip 200 may be one of a logic chip, a buffer chip, and a memory chip. For example, the semiconductor chip 200 may be a logic chip. The logic chip may include an applicant specific integrated circuit (ASIC) chip or an application processor (AP) chip. The ASIC chip may include an application specific integrated circuit (ASIC). Alternatively, the semiconductor chip 200 may include a central processing unit (CPU) or a graphic processing unit (GPU). The memory chip may include a high bandwidth memory (HBM) chip.

The semiconductor chip 200 may have a top surface and a bottom surface that are opposite to each other. The bottom surface of the semiconductor chip 200 may be in contact (e.g., have a direct physical connection) with the first redistribution substrate 100. The semiconductor chip 200 may include integrated circuits and chip pads 230. The integrated circuits may be provided in the semiconductor chip 200. The semiconductor chip 200 may have, on its bottom surface, chip pads 230 coupled to the integrated circuits. The phrase "a certain component is electrically connected to the semiconductor chip 200" may mean "the certain component is electrically connected to the integrated circuits through the chip pads 230 of the semiconductor chip 200." A first direction D1 may be parallel to the top surface of the semiconductor chip 200. A second direction D2 may be substantially perpendicular to the top surface of the semiconductor chip 200. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first redistribution substrate 100 may be provided on its top surface with the molding layer 400 that covers the semiconductor chip 200. For example, the molding layer 400 may cover top and side surfaces of the semiconductor chip 200. Differently from that shown, the molding layer 400 may cover the side surface of the semiconductor chip 200, but may expose (i.e., not cover) the top surface of the semiconductor chip 200. The molding layer 400 may have a side surface vertically aligned with that of the first redistribution substrate 100. The molding layer 400 may not extend between the first redistribution substrate 100 and the semiconductor chip 200. The molding layer 400 may include or may be formed of a dielectric polymer, such as an epoxy-based molding compound.

The first redistribution substrate 100 may include a first dielectric layer 101, first redistribution patterns 120, and first seed patterns 125. The first dielectric layer 101 may be disposed on and cover the bottom surface of the semiconductor chip 200 and a bottom surface of the molding layer 400. For example, the first dielectric layer 101 may be in contact with the bottom surface of the semiconductor chip 200 and with the bottom surface of the molding layer 400. The first dielectric layer 101 may include or may be formed of an organic material, such as a photo-imageable dielectric (PID) material. The photo-imageable dielectric material may include or may be formed of, for example, at least one selected from photosensitive polyimide, polybenzoxazole, phenolic polymers, and benzocyclobutene polymers. Although not illustrated, a plurality of first dielectric layers 101 may be provided and may be stacked on each other. The number of stacked first dielectric layers 101 may be variously changed. The plurality of first dielectric layers 101 may include, for example, the same material. An indistinct interface may be provided between neighboring first dielectric layers 101. The top surface of the first redistribution substrate 100 may include a top surface of an uppermost first dielectric layer 101.

The first redistribution patterns 120 may be provided in the first dielectric layers 101. The first redistribution patterns 120 may be laterally spaced apart and electrically separated from each other. The phrase "two components are laterally spaced apart from each other" may mean "two components are horizontally spaced apart from each other." The term "horizontal/horizontally" may indicate "parallel to the top surface of the semiconductor chip 200 or to the first direction D1." The first redistribution patterns 120 may include or may be formed of metal, such as copper. The phrase "electrically connected to the first redistribution substrate 100" may include the meaning of "electrically connected to at least one of the first redistribution patterns 120."

Each of the first redistribution patterns 120 may include a first via and a first line. The first via of each of the first redistribution patterns 120 may be provided in a corresponding first dielectric layer 101. The first line may be provided with the first via, and the first line and the first via may be connected without any interface therebetween. The first line may have a width greater than a top surface of the first via. The first line may extend onto a bottom surface of a corresponding first dielectric layer 101. In this description, the component "via" may be a component for vertical connection, and the component "line" may be a component for horizontal connection. The term "vertical/vertically" may mean "perpendicular to the top surface of the semiconductor chip 200 or parallel to the second direction D2." In this description, the word "level" may denote a vertical level, and a level difference may be measured in the second direction D2.

Each of the first redistribution patterns 120 may include a first sub-redistribution pattern 121 and a second sub-redistribution pattern 122. The first via of each of the first sub-redistribution patterns 121 may be disposed on a bottom surface of a corresponding chip pad 230 in the semiconductor chip 200. The second sub-redistribution pattern 122 may be disposed on a bottom surface of the first sub-redistribution pattern 121 and may be coupled to the first sub-redistribution pattern 121.

The number of stacked first redistribution patterns 120 may not be limited to that shown, but may be variously changed. For example, the first sub-redistribution patterns 121 may be omitted, and the second sub-redistribution patterns 122 may be disposed on the bottom surfaces of the chip pads 230. For another example, third sub-redistribution patterns (not shown) may further be provided between the first sub-redistribution patterns 121 and the second sub-redistribution patterns 122.

The first redistribution patterns 120 may be correspondingly provided with first seed patterns 125 on bottom surfaces thereof. For example, each of the first seed patterns 125 may cover top and side surfaces of the first via of a corresponding first redistribution pattern 120 and may also cover a top surface of the first line of the corresponding first redistribution pattern 120. Each of the first seed patterns 125 may not extend onto a side surface of the first line of the corresponding first redistribution pattern 120. The first seed patterns 125 in the uppermost first dielectric layer 101 may be interposed between the chip pads 230 and the first sub-redistribution patterns 121. The first seed patterns 125 in the uppermost first dielectric layer 101 may be in contact with the chip pads 230. The first seed patterns 125 may include a material different from that of the first redistribution patterns 120. For example, the first seed patterns 125 may include a conductive seed material. The conductive seed material may include or may be formed of one or more of copper, titanium, and any alloy thereof. The first seed patterns 125 may serve as barrier layers to prevent diffusion of materials included in the first redistribution patterns 120.

The protection layer 301 covers a lowermost first dielectric layer 101. The protection layer 301 also covers a bottom and side surfaces of the second redistribution patterns 122. The protection layer 301 may have a relatively large elongation. For example, the protection layer 301 may have an elongation the same as or greater than that of the first dielectric layers 101. Therefore, the protection layer 301 may absorb stress. The stress may arise due to a difference in thermal expansion coefficient between components, but the present inventive concepts are not limited thereto. The protection layer 301 may include or may be formed of, for example, silicone, polymer, adhesive dielectric film, or photo-imageable dielectric (PID). The polymer may be, for example, polyimide or epoxy-based polymer. The adhesive dielectric film may include an Ajinomoto build-up film (ABF). As used herein, the term "elongation" refers to the measure of the ductility (i.e., the degree to which a material can be changed or deformed under tensile stress before failure, such a fracture or rupture) of a material. The elongation may be measured through a standard tensile test according to JIS C-6481, KS M 3001, KS M 527-3, ASTM D8882, or the like.

The conductive pattern 320 may be disposed on the bottom surface of each of the second sub-redistribution patterns 122. As shown in FIG. 1B, each of the conductive patterns 320 may include a via part 327, a first line part 321, and a second line part 322. For brevity of description, the following will describe a single conductive pattern 320 and a single second sub-redistribution pattern 122.

The via part 327 of the conductive pattern 320 may be provided in the protection layer 301. The via part 327 may be provided on the bottom surface of the second sub-redistribution pattern 122 and may be coupled to the second sub-redistribution pattern 122. The via part 327 may be located at a level higher than that of a bottom surface of the protection layer 301. The first line part 321 may be provided on a bottom surface of the via part 327, and the first line part 321 and the via part 327 may be connected without any interface therebetween. The second line part 322 may be provided on the bottom surface of the protection layer 301. The second line part 322 may not vertically overlap the via part 327. The second line part 322 and the first line part 321 may be connected without any interface therebetween. The first line part 321 may be provided between and connected to the via part 327 and the second line part 322. The conductive pattern 320 may include metal, such as copper.

The semiconductor package 10 may further include a conductive seed pattern 325. The conductive seed pattern 325 may be provided between the conductive pattern 320 and the protection layer 301 and between the conductive pattern 320 and the second sub-redistribution pattern 122. The conductive seed pattern 325 may cover top and side surfaces of the via part 327 and a top surface of the second line part 322. The conductive seed pattern 325 may further cover a top surface of the first line part 321. The conductive seed pattern 325 may include a conductive seed material. For example, the conductive seed pattern 325 may include a material different from that of the conductive pattern 320. For example, the conductive seed pattern 325 and the conductive pattern 320 may include or may be formed of titanium or an alloy of titanium-copper. For another example, the conductive seed pattern 325 may include the same material (e.g., copper) as that of the conductive pattern 320. In this case, an indistinct interface may be provided between the conductive seed pattern 325 and the conductive pattern 320. The conductive seed pattern 325 may have a thickness less than that of the second line part 322.

The buffer pattern 340 may cover the bottom surface of the protection layer 301 and a bottom surface of the conductive pattern 320. The buffer pattern 340 may be in contact with the protection layer 301 and the conductive pattern 320. The buffer pattern 340 may cover a bottom surface of the conductive pattern 320. For example, the buffer pattern 340 may cover and contact a bottom surface of the first line part 321 included in the conductive pattern 320. The buffer pattern 340 may also cover and contact side surfaces of the conductive pattern 320. The buffer pattern 340 may expose (i.e., not cover) a bottom surface of the second line part 322 included in the conductive pattern 320. For example, when viewed in plan as shown in FIG. 1D, the buffer pattern 340 may be spaced apart from the second line part 322.

The buffer pattern 340 may have a first surface and a second surface that are opposite to each other. The first surface may be a top surface of the buffer pattern 340, and the second surface may be a bottom surface of the buffer pattern 340. For example, the top surface of the buffer pattern 340 may have a first top surface 341a and a second top surface 342a. The first top surface 341a and the second top surface 342a of the buffer pattern 340 may be in contact with the protection layer 301 and the conductive pattern 320, respectively. The second top surface 342a of the buffer pattern 340 may be located at a different level (e.g., lower level) than that of the first top surface 341a of the buffer pattern 340.

The buffer pattern 340 may have a height H of about 5 μm to about 50 μm. The height H of the buffer pattern 340 may be a maximum height of the buffer pattern 340. For example, the height H of the buffer pattern 340 may be an interval between the bottom surface and the first top surface 341a of the buffer pattern 340. When the height H of the buffer pattern 340 is greater than about 50 μm, the semiconductor package 10 may be difficult to reduce its size. According to some embodiments, as the height H of the buffer pattern 340 is equal to or less than about 50 μm, the semiconductor package 10 may become small in size.

The buffer pattern 340 may have an elongation the same as or greater than that of the first dielectric layers 101. The buffer pattern 340 may be a dielectric buffer pattern. The buffer pattern 340 may include or may be formed of, for example, silicone, polymer, adhesive dielectric film, or photo-imageable dielectric (PID). The polymer may be, for example, polyimide or epoxy-based polymer.

The under bump pattern 350 may be provided on and cover the protection layer 301, the buffer pattern 340, and the conductive pattern 320. The under bump pattern 350 may have an edge portion that is provided on the second line part 322 of the conductive pattern 320, and the edge portion of the under bump pattern 350 may cover the bottom surface of the second line part 322 included in the conductive pattern 320. Therefore, the under bump pattern 350 may be electrically connected to the conductive pattern 320.

The semiconductor package 10 may further include an under bump seed pattern 355. The under bump seed pattern 355 may be provided on the under bump pattern 350. The under bump seed pattern 355 may be interposed between the under bump pattern 350 and the buffer pattern 340, between the under bump pattern 350 and the protection layer 301, and between the under bump pattern 350 and the second line part 322 of the conductive pattern 320. The under bump seed pattern 355 may have a thickness less than that of the under bump pattern 350. The under bump seed pattern 355 may include a conductive seed material. The under bump seed pattern 355 may include a material different from that of the under bump pattern 350. For example, the under bump seed pattern 355 may include or may be formed of titanium or an alloy of titanium-copper. For another example, the under bump seed pattern 355 may include a material the same as that of the under bump pattern 350. In this case, an indistinct interface may be provided between the under bump seed pattern 355 and the under bump pattern 350.

The solder ball 500 may be provided on the bottom surface of the first redistribution substrate 100. For example, the solder ball 500 may be disposed on and coupled to a corresponding under bump pattern 350. The solder ball 500 may include a solder material. The solder material may include or may be formed of, for example, tin, bismuth, lead, silver, or any alloy thereof.

When the buffer pattern 340 and the conductive pattern 320 are omitted, the under bump pattern 350 may be provided on and in contact with the second sub-redistribution pattern 122. In this case, stress may be applied between the under bump pattern 350 and the solder ball 500 or between the under bump pattern 350 and the second sub-redistribution pattern 122. While the semiconductor package 10 operates, the stress may arise due to a difference in thermal expansion coefficient between components. The stress may cause cracks between the under bump pattern 350 and the solder ball 500 or between the under bump pattern 350 and the second sub-redistribution pattern 122. In this case, contact failure may occur between the solder ball 500 and the second sub-redistribution pattern 122.

The under bump pattern 350 may cover a side surface 340c and a bottom surface 340b of the buffer pattern 340, and may also cover the protection layer 301 and the bottom surface of the second line part 322 included in the conductive pattern 320. The under bump pattern 350 may contact the side surface 340c and the bottom surface 340b of the buffer pattern 340. According to some embodiments, as the buffer pattern 340 is provided, the under bump pattern 350 may have a step difference (i.e., the under bump pattern 350 may extend along different levels in the second direction D2). For example, the under bump pattern 350 may have a first bottom surface 350a, a second bottom surface 350b, and a third bottom surface 350c located at different levels in the second direction D2. The first bottom surface 350a of the under bump pattern 350 may be provided on the bottom surface 340b of the buffer pattern 340. The second bottom surface 350b of the under bump pattern 350 may be provided on the bottom surface of the second line part 322. The second bottom surface 350b of the under bump pattern 350 may be located at a different level (e.g., higher level) from that of the first bottom surface 350a of the under bump pattern 350. The third bottom surface 350c of the under bump pattern 350 may be provided on the bottom surface of the protection layer 301. The third bottom surface 350c of the under bump pattern 350 may be located at a different level from those of the first and second bottom surfaces 350a and 350b of the under bump pattern 350. For example, the third bottom surface 350c of the under bump pattern 350 may be located at a higher level than the levels of the first and second bottom surfaces 350a and 350b of the under bump pattern 350. The first, second, and third bottom surfaces 350a, 350b, and 350c of the under bump pattern 350 may be located at different levels from each other, and the solder ball 500 may cover and contact the first, second, and third bottom surfaces 350a, 350b, and 350c of the under bump pattern 350. A contact area may as a result be increased between the under bump pattern 350 and the solder ball 500. Therefore, an increased bonding force may be provided between the under bump pattern 350 and the solder ball 500, and thus the occurrence of crack may be prevented between the under bump pattern 350 and the solder ball 500. Accordingly, the semiconductor package 10 may increase in reliability and durability.

The under bump pattern 350 may include a first part and a second part. For example, the first part of the under bump pattern 350 may be provided on the bottom surface 340b of the buffer pattern 340. The first part of the under bump pattern 350 may extend in a direction parallel to the first direction D1. The first part of the under bump pattern 350 may be provided on the side surface 340c of the buffer pattern 340 and may extend in a direction parallel to the second direction D2. Cracks may be difficult to propagate from one surface in one direction toward another surface in another direction. Therefore, even when cracks are produced between the solder ball 500 and the under bump pattern 350, the crack may be prevented from propagating. Consequently, the semiconductor package 10 may increase in reliability and durability.

As the height H of the buffer pattern 340 is greater than about 5 μm, the under bump pattern 350 may have a step difference such that a contact area may increase between the under bump pattern 350 and the solder ball 500.

The buffer pattern 340 may have a relatively large elongation. For example, the buffer pattern 340 may have an elongation the same as or greater than that of the first dielectric layers 101. Even when stress is applied to the under bump pattern 350 and the solder ball 500, the stress may be absorbed by the buffer pattern 340.

As the buffer pattern 340 is in contact with the protection layer 301, stress may be partially transferred to the protection layer 301. The protection layer 301 may have an elongation the same as or greater than that of the first dielectric layers 101. The stress may be absorbed by the protection layer 301. Therefore, the semiconductor package 10 may increase in reliability and durability.

As shown in FIG. 1C, the under bump pattern 350 may have a width W2 greater than a width W1 of the buffer pattern 340. A width of a component may be measured in the first direction D1. The under bump pattern 350 may have a length greater than that of the buffer pattern 340. A length of a component may be measured in a third direction (not shown) perpendicular to the first direction D1 and the second direction D2. Therefore, the under bump pattern 350 may cover the bottom and side surfaces 340b and 340c of the buffer pattern 340, may also cover the second line part 322 of the conductive pattern 320, and may have a step difference.

The width W1 and the length of the buffer pattern 340 may be greater than those of the via part 327 of the conductive pattern 320.

A range of about 10 μm to about 120 μm may be given as a first interval D between an outer wall of the under bump pattern 350 and the side surface 340c of the buffer pattern 340. The side surface 340c of the buffer pattern 340 may be directed toward the outer wall of the under bump pattern 350. Because the first interval D is equal to or greater than about 10 μm, an increased bonding force may be provided between the under bump pattern 350 and the solder ball 500. When the first interval D is greater than about 120 μm, the width W1 of the buffer pattern 340 may become smaller. In this case, the buffer pattern 340 may be insufficient to absorb stress. According to some embodiments, because the first interval D is equal to or less than about 120 μm, the buffer pattern 340 may satisfactorily absorb stress.

When stress applied to the under bump pattern 350 is transferred to the via part 327 of the conductive pattern 320, cracks may occur between the under bump pattern 350 and the conductive pattern 320 or between the conductive pattern 320 and the second sub-redistribution pattern 122. According to some embodiments, because the buffer pattern 340 is provided between the under bump pattern 350 and the via part 327 of the conductive pattern 320, the stress applied to the under bump pattern 350 may be prevented from being directly transferred to the via part 327 of the conductive pattern 320. The occurrence of a crack may be prevented between the under bump pattern 350 and the conductive pattern 320 and between the conductive pattern 320 and the second sub-redistribution pattern 122.

When the buffer pattern 340 and the conductive pattern 320 are omitted, the under bump pattern 350 may be directly disposed on a certain one of a plurality of second sub-redistribution patterns 122. In this case, it may be required that the certain second sub-redistribution pattern 122 have a width greater than that of the under bump pattern 350. Therefore, limitations may be imposed on the number and arrangement of other second sub-redistribution patterns 122. According to some embodiments, as the conductive pattern 320 is provided, the second sub-redistribution patterns 122 may be less limited in terms of width, arrangement, and/or number. Accordingly, there may be an increase in the degree of freedom in designing the first redistribution patterns 120.

As shown in FIG. 1A, the semiconductor package 10 may include a plurality of solder balls 500, a plurality of under bump patterns 350, a plurality of buffer patterns 340, and a plurality of conductive patterns 320. The under bump pattern 350 may be electrically connected to the semiconductor chip 200 through the conductive pattern 320 and the first redistribution patterns 120.

Figure 2A:
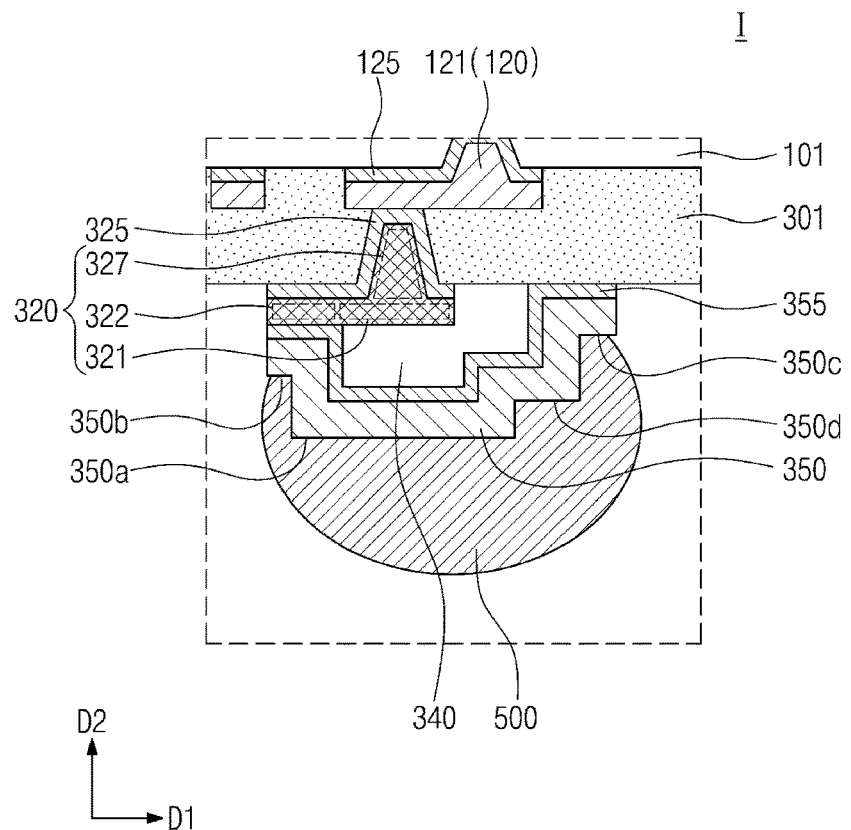
FIG. 2A illustrates a cross-sectional view showing a buffer pattern and an under bump pattern according to some embodiments.

FIG. 2A illustrates an enlarged view of section I depicted in FIG. 1A, showing a buffer pattern and an under bump pattern according to some embodiments.

Referring to FIG. 2A, the buffer pattern 340 may have a step difference on a bottom surface thereof. For example, the bottom surface of a portion of the buffer pattern 340 in contact with the bottom surface of the protection layer 301 may be located at a higher level than that of the bottom surface of a portion of the buffer pattern 340 in contact with the bottom surface of the conductive pattern 320.

The bottom surface of the under bump pattern 350 may have a fourth bottom surface 350d in addition to the first bottom surface 350a, the second bottom surface 350b, and the third bottom surface 350c. The first, second, and third bottom surfaces 350a, 350b, and 350c may be substantially the same as those discussed in the example of FIG. 1B.

When viewed in plan, the fourth bottom surface 350d of the under bump pattern 350 may be provided between the first bottom surface 350a and the third bottom surface 350c. The fourth bottom surface 350d of the under bump pattern 350 may be located at a level different from those of the first and third bottom surfaces 350a and 350c. For example, the fourth bottom surface 350d of the under bump pattern 350 may be located at a level higher than that of the first bottom surface 350a and lower than that of the third bottom surface 350c. As the under bump pattern 350 further has the fourth bottom surface 350d, an increased contact area may be provided between the under bump pattern 350 and the solder ball 500. The shape of the under bump pattern 350 and the buffer pattern 340 is not limited to that shown in figures, but may be variously changed.

Figure 2B:
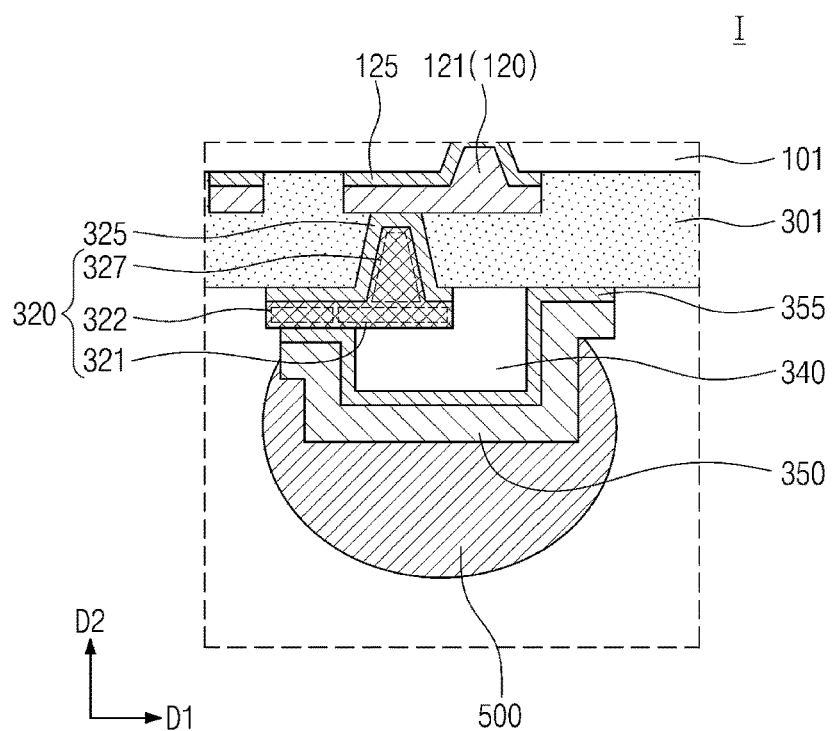
FIG. 2B illustrates a cross-sectional view showing an under bump pattern and a conductive pattern according to some embodiments.

FIG. 2B illustrates an enlarged view of section I depicted in FIG. 1A, showing an under bump pattern and a conductive pattern according to some embodiments.

Referring to FIG. 2B, the under bump pattern 350 may cover a portion of the second line part 322 of the conductive pattern 320, but may expose (i.e., not cover) another portion of the second line part 322. A portion of the under bump seed pattern 355 may be interposed between the under bump pattern 350 and the second line part 322 of the conductive pattern 320. When viewed in plan, the under bump pattern 350 may have an outer surface provided below the bottom surface of the second line part 322 included in the conductive pattern 320.

Figure 2C:
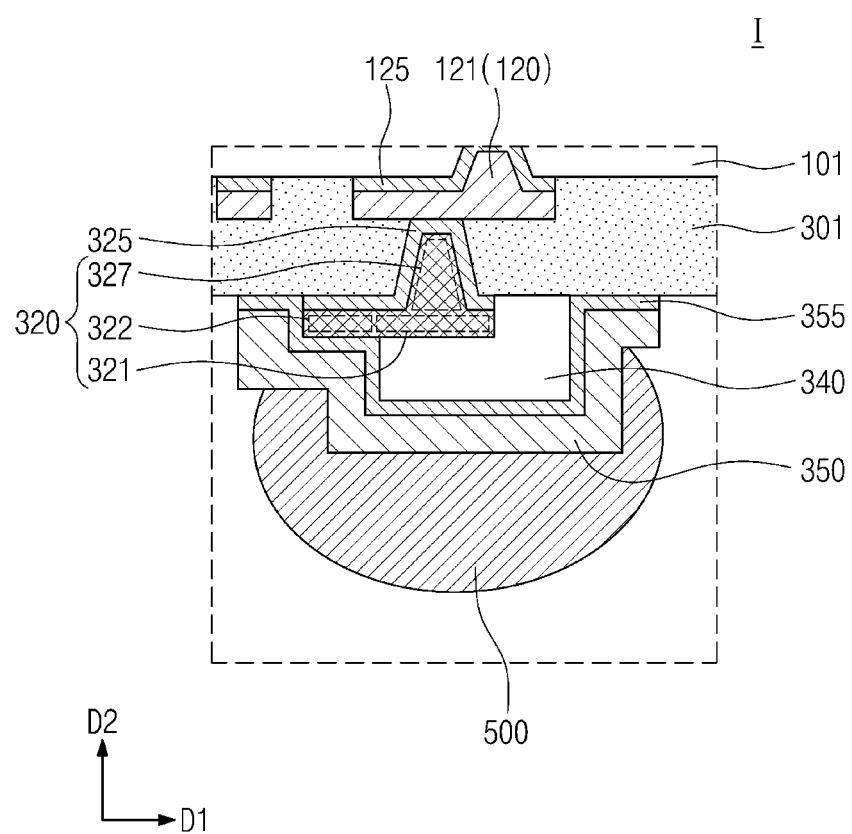
FIG. 2C illustrates a cross-sectional view showing an under bump pattern and a conductive pattern according to some embodiments.

FIG. 2C illustrates an enlarged view of section I depicted in FIG. 1A, showing a buffer pattern and an under bump pattern according to some embodiments.

Referring to FIG. 2C, the under bump pattern 350 may be provided on the bottom and side surfaces of the second line part 322 included in the conductive pattern 320. The under bump seed pattern 355 may be interposed between the under bump pattern 350 and the bottom surface of the second line part 322, between the under bump pattern 350 and the side surface of the second line part 322, and between the under bump pattern 350 and the bottom surface of the protection layer 301.

Figure 3:
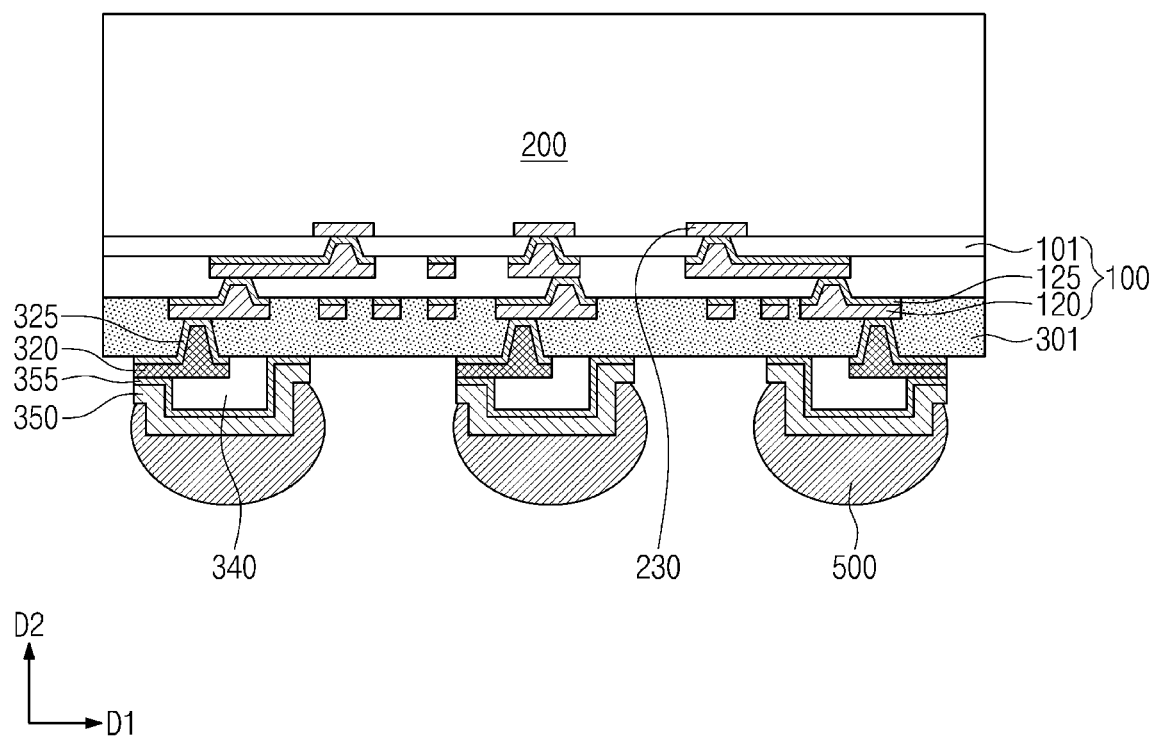
FIG. 3 illustrates a cross-sectional view showing a semiconductor package according to some embodiments.

FIG. 3 illustrates a cross-sectional view showing a semiconductor package according to some embodiments.

Referring to FIG. 3, a semiconductor package 10A may include a first redistribution substrate 100, a semiconductor chip 200, a protection layer 301, a conductive pattern 320, a buffer pattern 340, an under bump pattern 350, and a solder ball 500. The semiconductor package 10A may not include a molding layer (see 400 of FIG. 1A). The semiconductor chip 200 may have a width substantially the same as that of the first redistribution substrate 100. The semiconductor chip 200 may have a side surface vertically aligned with that of the first redistribution substrate 100.

The solder ball 500, the protection layer 301, the conductive pattern 320, the buffer pattern 340, the under bump pattern 350, and the semiconductor chip 200 may be substantially the same as those discussed in the example of FIG. 1A to 1D, the example of FIG. 2A, the example of FIG. 2B, or the example of FIG. 2C.

Figure 4A:
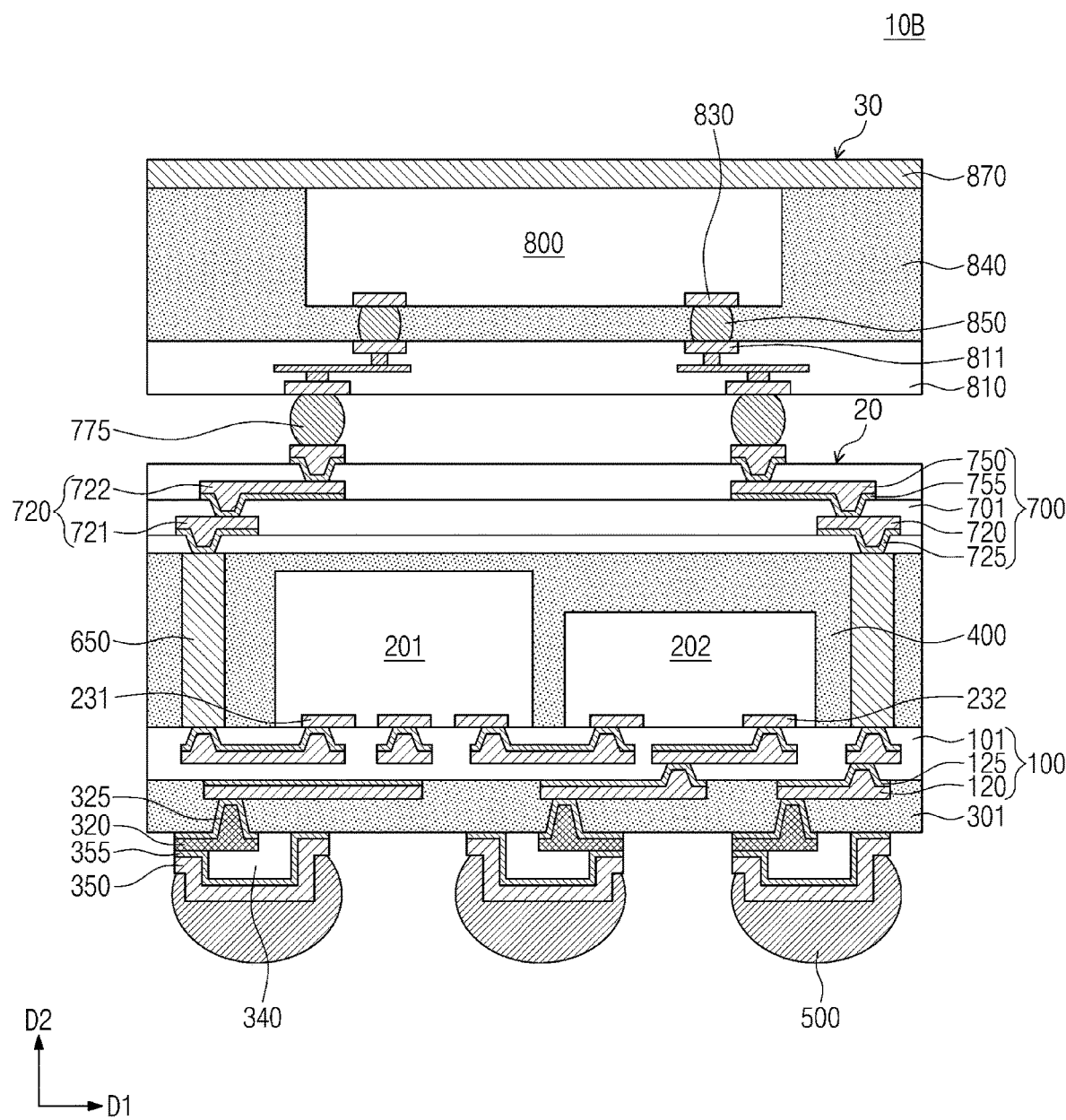
FIG. 4A illustrates a cross-sectional view showing a semiconductor package according to some embodiments.

FIG. 4A illustrates a cross-sectional view showing a semiconductor package according to some embodiments.

Referring to FIG. 4A, a semiconductor package 10B may include a lower package 20, an upper package 30, and connection bumps 775. The lower package 20 may include a first redistribution substrate 100, a solder ball 500, a protection layer 301, a conductive pattern 320, a buffer pattern 340, an under bump pattern 350, a first semiconductor chip 201, a second semiconductor chip 202, conductive structures 650, and a second redistribution substrate 700. The solder ball 500, the protection layer 301, the conductive pattern 320, the buffer pattern 340, the under bump pattern 350, and the semiconductor chip 200 may be substantially the same as those discussed above.

Each of the first and second semiconductor chips 201 and 202 may be mounted on a top surface of the first redistribution substrate 100. Each of the first and second semiconductor chips 201 and 202 may be identical or similar to the semiconductor chip 200 discussed in FIG. 1A. The second semiconductor chip 202 may be disposed laterally spaced apart from the first semiconductor chip 201. The second semiconductor chip 202 may be of a different type from the first semiconductor chip 201. In some embodiments, the first semiconductor chip 201 may include one of logic, memory, and power management chips, and the second semiconductor chip 202 may include one of logic, memory, and power management chips. The power management chip may include a power management integrated circuit (PMIC). For example, the first semiconductor chip 201 may be an application specific integrated circuit (ASIC) chip, and the second semiconductor chip 202 may be a power management chip. Alternatively, the second semiconductor chip 202 may be of the same type as the first semiconductor chip 201. Differently from that shown, one or both of the first and second semiconductor chips 201 and 202 may be omitted. In another aspect, a third semiconductor chip (not shown) may further be mounted on the top surface of the first redistribution substrate 100.

The first redistribution substrate 100 may be provided with conductive structures 650 on the top surface thereof. For example, the conductive structures 650 may be disposed on the top surface at an edge region of the first redistribution substrate 100. The conductive structures 650 may be laterally spaced apart from the first semiconductor chip 201 and the second semiconductor chip 202. The conductive structures 650 may be spaced apart from each other. A metal pillar may be provided on the first redistribution substrate 100, forming the conductive structure 650. For example, the conductive structure 650 may be a metal pillar. The conductive structure 650 may include or may be formed of metal, such as copper.

The first seed patterns 125 in the uppermost first dielectric layer 101 may be in contact with the first chip pads 231 of the first semiconductor chip 201, the second chip pads 232 of the second semiconductor chip 202, or the conductive structures 650. The first and second semiconductor chips 201 and 202 may be electrically connected to each other through the first redistribution substrate 100. Each of the conductive structures 650 may be electrically connected through the first redistribution substrate 100 to a corresponding one of the first semiconductor chip 201, the second semiconductor chip 202, and the solder ball 500.

The first redistribution substrate 100 may be provided on its top surface with a molding layer 400 that covers the first semiconductor chip 201 and the second semiconductor chip 202. The molding layer 400 may further cover side surfaces of the conductive structures 650. The molding layer 400 may not cover a top surface of the conductive structure 650. The molding layer 400 may have a side surface aligned with that of the first redistribution substrate 100.

The second redistribution substrate 700 may be provided on a top surface of the molding layer 400 and top surfaces of the conductive structures 650. The second redistribution substrate 700 may include second dielectric layers 701, second redistribution patterns 720, and redistribution pads 750. The second dielectric layers 701 may be stacked on the molding layer 400. The second dielectric layers 701 may be organic dielectric layers. The molding layer 400 may include or may be formed of an adhesive dielectric film, such as an Ajinomoto build-up film. Alternatively, the molding layer 400 may include or may be formed of a dielectric polymer, such as an epoxy-based polymer. For another example, the second dielectric layers 701 may include or may be formed of a photo-imageable dielectric material. The second dielectric layers 701 may include the same material. An indistinct interface may be provided between neighboring second dielectric layers 701, but the present inventive concepts are not limited thereto. The number of the second dielectric layers 701 may be variously changed.

The second redistribution patterns 720 may be laterally spaced apart and electrically separated from each other. Each of the second redistribution patterns 720 may include a second via and a second line. The second via may be provided in a corresponding second dielectric layer 701. The second line may be provided on the second via. The second line of each of the second redistribution patterns 720 may have a width greater than that of a top surface of the second via. The second line of each of the second redistribution patterns 720 may extend onto a top surface of a second dielectric layer 701. The second redistribution patterns 720 may include or may be formed of metal, such as copper.

Each of the second redistribution patterns 720 may include a lower redistribution pattern 721 and an upper redistribution pattern 722 that are stacked. The second via of the lower redistribution pattern 721 may be disposed on and coupled to a corresponding conductive structure 650. The upper redistribution pattern 722 may be disposed on and coupled to the lower redistribution pattern 721. The phrase "electrically connected to the second redistribution substrate 700" may mean "electrically connected to at least one of the second redistribution patterns 720."

The second redistribution substrate 700 may further include second seed patterns 725. The second seed patterns 725 may be correspondingly disposed on bottom surfaces of the second redistribution patterns 720. For example, each of the second seed patterns 725 may be provided on bottom and side surfaces of the second via of a corresponding second redistribution pattern 720, and may extend onto a bottom surface of the second line of the corresponding second redistribution pattern 720. The second seed patterns 725 may include a material the same as or different from that of the conductive structures 650 and the second redistribution patterns 720. For example, the second seed patterns 725 may include a conductive seed material. The second seed patterns 725 may further serve as barrier layers to prevent diffusion of materials included in the second redistribution patterns 720.

The redistribution pads 750 may be disposed on and coupled to corresponding upper redistribution patterns 722. The redistribution pads 750 may be laterally spaced apart from each other. The redistribution pads 750 may be coupled through the second redistribution patterns 720 to the conductive structures 650. As the second redistribution patterns 720 are provided, at least one redistribution pad 750 may not be vertically aligned with the conductive structure 650 electrically connected thereto. Therefore, it may be possible to freely design an arrangement of the redistribution pads 750.

A lower portion of each of the redistribution pads 750 may be provided in an uppermost second dielectric layer 701. An upper portion of each of the redistribution pads 750 may extend onto a top surface of the uppermost second dielectric layer 701. The upper portion of each of the redistribution pads 750 may have a width greater than that of the lower portion of each of the redistribution pads 750. The redistribution pads 750 may include or may be formed of metal, such as copper.

The second redistribution substrate 700 may further include seed pads 755. The seed pads 755 may be correspondingly interposed between the upper redistribution patterns 722 and the redistribution pads 750. The seed pads 755 may further extend between the upper redistribution patterns 722 and the uppermost second dielectric layer 701. The seed pads 755 may include a conductive seed material.

The number of stacked second redistribution patterns 720 may be variously changed. For example, the upper redistribution pattern 722 may be omitted, and each of the redistribution pads 750 may be disposed on the lower redistribution pattern 721. For another example, an intermediate redistribution pattern (not shown) may further be provided between the lower redistribution pattern 721 and the upper redistribution pattern 722.

The upper package 30 may be disposed on the lower package 20. For example, the upper package 30 may be disposed on the second redistribution substrate 700. The upper package 30 may include an upper substrate 810, an upper semiconductor chip 800, and an upper molding layer 840. The upper substrate 810 may be a printed circuit board or a redistribution layer. The upper substrate 810 may be provided with substrate pads 811 on a top surface thereof.

The upper semiconductor chip 800 may be disposed on the upper substrate 810. The upper semiconductor chip 800 may include integrated circuits, and the integrated circuits may include a memory circuit, a logic circuit, or a combination thereof. The upper semiconductor chip 800 may be of a different type from the first semiconductor chip 201 and the second semiconductor chip 202. For example, the upper semiconductor chip 800 may be a memory chip. The upper substrate 810 and the upper semiconductor chip 800 may be provided therebetween with upper bumps 850 coupled to the substrate pads 811 and to upper chip pads 830 of the upper semiconductor chip 800. The upper bumps 850 may include a solder material. Differently from that shown, the upper bumps 850 may be omitted, and the upper semiconductor chip 800 may be directly disposed on the upper substrate 810. For example, the upper chip pads 830 may be directly coupled to the substrate pads 811. The phrase "coupled to the upper substrate 810" may mean "coupled to metal lines in the upper substrate 810."

The upper substrate 810 may be provided thereon with the upper molding layer 840 that covers the upper semiconductor chip 800. The upper molding layer 840 may extend into a gap between the upper substrate 810 and the upper semiconductor chip 800, thereby encapsulating the upper bumps 850. Alternatively, an under fill layer (not shown) may further be interposed between the upper substrate 810 and the upper semiconductor chip 800. The upper molding layer 840 may include or may be formed of a dielectric polymer, such as an epoxy-based polymer.

The upper package 30 may further include an upper thermal dissipation plate 870. The upper thermal dissipation plate 870 may be disposed on a top surface of the upper semiconductor chip 800 and a top surface of the upper molding layer 840. The upper thermal dissipation plate 870 may include at least one selected from a heat sink, a heat slug, and a thermal interface material layer. The upper thermal dissipation plate 870 may include, for example, metal. Differently from that shown, the upper thermal dissipation plate 870 may further extend onto a side surface of the upper molding layer 840 or a side surface of the molding layer 400. Alternatively, the upper thermal dissipation plate 870 may be omitted, and the upper molding layer 840 may further cover the top surface of the upper semiconductor chip 800.

The connection bumps 775 may be interposed between the second redistribution substrate 700 and the upper substrate 810, thereby being coupled to the redistribution pads 750 and the upper substrate 810. Therefore, the upper package 30 may be electrically connected thorough the connection bumps 775 to the second redistribution substrate 700. The connection bumps 775 may include a solder material. The connection bumps 775 may further include metal pillars. An electrical connection with the upper package 30 may mean an electrical connection with integrated circuits in the upper semiconductor chip 800.

Alternatively, the upper substrate 810 and the connection bumps 775 may be omitted, and the upper bumps 850 may be directly coupled to the redistribution pads 750. In this case, the upper molding layer 840 may be in contact with a top surface of the second redistribution substrate 700. In another aspect, the upper substrate 810, the connection bumps 775, and the upper bumps 850 may be omitted, and the upper chip pads 830 of the upper semiconductor chip 800 may be directly coupled to the redistribution pads 750.

Figure 4B:
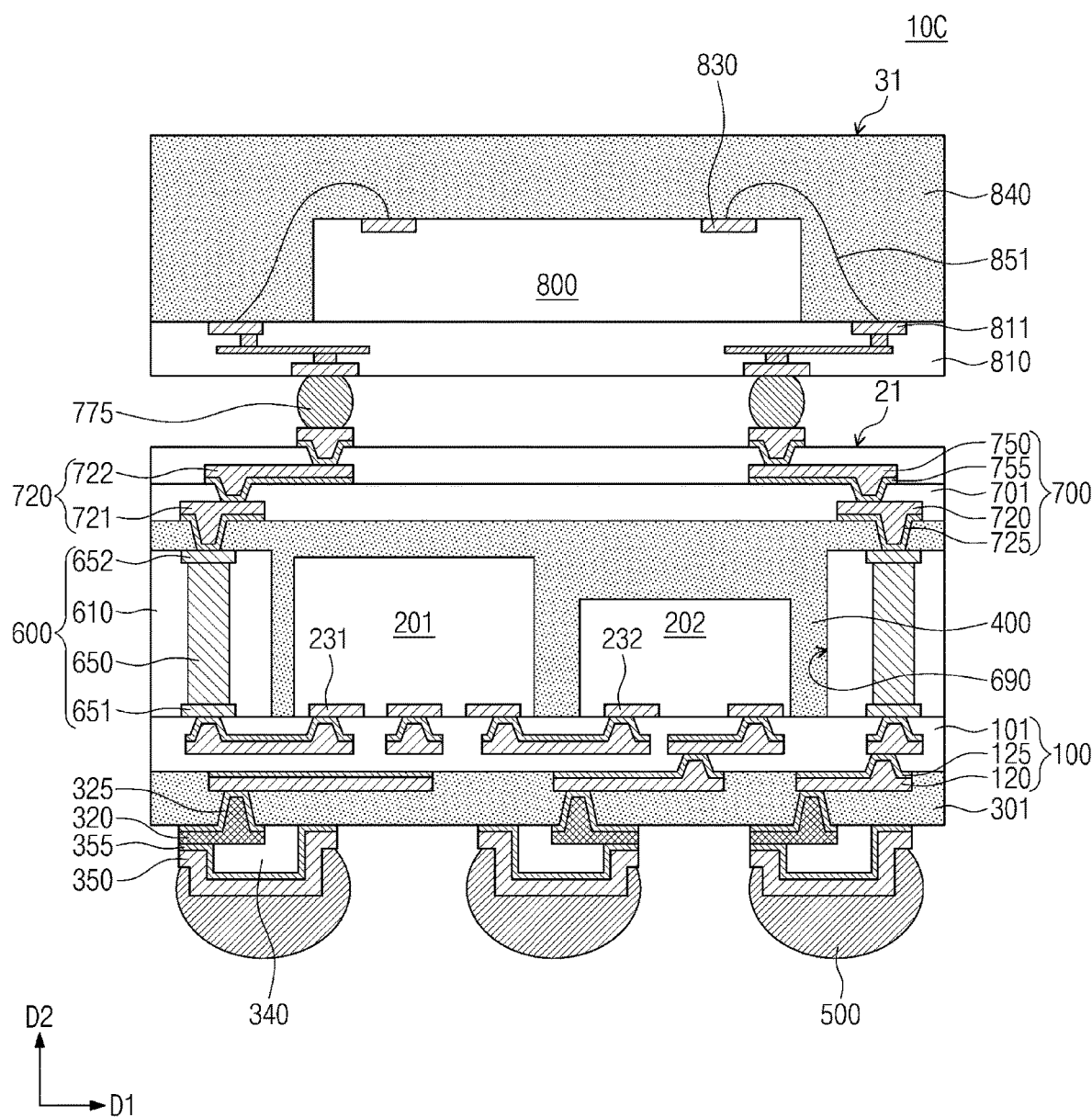
FIG. 4B illustrates a cross-sectional view showing a semiconductor package according to some embodiments.

FIG. 4B illustrates a cross-sectional view showing a semiconductor package according to some embodiments.

Referring to FIG. 4B, a semiconductor package 10C may include a lower package 21, an upper package 31, and connection bumps 775. The lower package 21 may include a first redistribution substrate 100, a solder ball 500, a protection layer 301, a conductive pattern 320, a buffer pattern 340, an under bump pattern 350, a first semiconductor chip 201, a second semiconductor chip 202, conductive structures 650, a second redistribution substrate 700, and a connection substrate 600.

The connection substrate 600 may be disposed on the first redistribution substrate 100. The connection substrate 600 may have a substrate hole 690 that penetrates therethrough. For example, the connection substrate 600 may be manufactured by forming the substrate hole 690 that penetrates top and bottom surfaces of a printed circuit board. When viewed in plan, the substrate hole 690 may be formed on a central portion of the connection substrate 600. The first and second semiconductor chips 201 and 202 may be disposed in the substrate hole 690 of the connection substrate 600. The first and second semiconductor chips 201 and 202 may be disposed spaced apart from an inner side surface of the connection substrate 600.

The connection substrate 600 may include a base layer 610, first pads 651, conductive structures 650, and second pads 652. The base layer 610 may include a dielectric material. For example, the base layer 610 may include or may be formed of a carbon-based material, a ceramic, or a polymer. The substrate hole 690 may penetrate the base layer 610. The conductive structures 650 may be provided in the base layer 610. The first pads 651 may be provided on bottom surfaces of the conductive structures 650. The first pads 651 may be exposed on a bottom surface of the connection substrate 600. The second pads 652 may be disposed on top surfaces of the conductive structures 650. The second pads 652 may be exposed on a top surface of the connection substrate 600. The second pads 652 may be electrically connected through the conductive structures 650 to the first pads 651. The conductive structures 650, the first pads 651, and the second pads 652 may include or may be formed of metal, such as copper, aluminum, tungsten, titanium, tantalum, or any alloy thereof.

A molding layer 400 may be provided between the first and second semiconductor chips 201 and 202, between the first semiconductor chip 201 and the connection substrate 600, and between the second semiconductor chip 202 and the connection substrate 600. The molding layer 400 may cover top surfaces of the first and second semiconductor chips 201 and 202 and a top surface of the connection substrate 600. According to some embodiments, an adhesive dielectric film may be attached to a top surface of the connection substrate 600, a top surface of the semiconductor chip 200, and side surfaces of the first and second semiconductor chips 201 and 202, thereby forming the molding layer 400. For example, an Ajinomoto build-up film (ABF) may be used as the adhesive dielectric film. Alternatively, the molding layer 400 may include a dielectric polymer, such as an epoxy-based polymer.

The second redistribution substrate 700 may be disposed on the molding layer 400 and the connection substrate 600. The second redistribution substrate 700 may be substantially the same as that discussed in the example of FIG. 4A. In contrast, the lower redistribution patterns 721 may further extend into the molding layer 400 and may be coupled to the second pads 652.

The upper package 31 may be disposed on the lower package 21. The upper package 31 may include an upper substrate 810, an upper semiconductor chip 800, and an upper molding layer 840. The upper package 31 may further include a thermal dissipation plate 870. The upper package 31 and the connection bumps 775 may be substantially the same as those discussed in FIG. 4A. In contrast, the upper chip pads 830 may be provided on a top surface of the upper semiconductor chip 800. The upper bumps (see 850 of FIG. 4A) may be omitted. The upper chip pads 830 may be provided thereon with bonding wires 851 electrically connected to the upper chip pads 830 and the substrate pads 811.

Differently from that shown, the upper package 31 may include the upper bumps 850 discussed in the example of FIG. 4a, but may not include the bonding wires 851.

Figure 5:
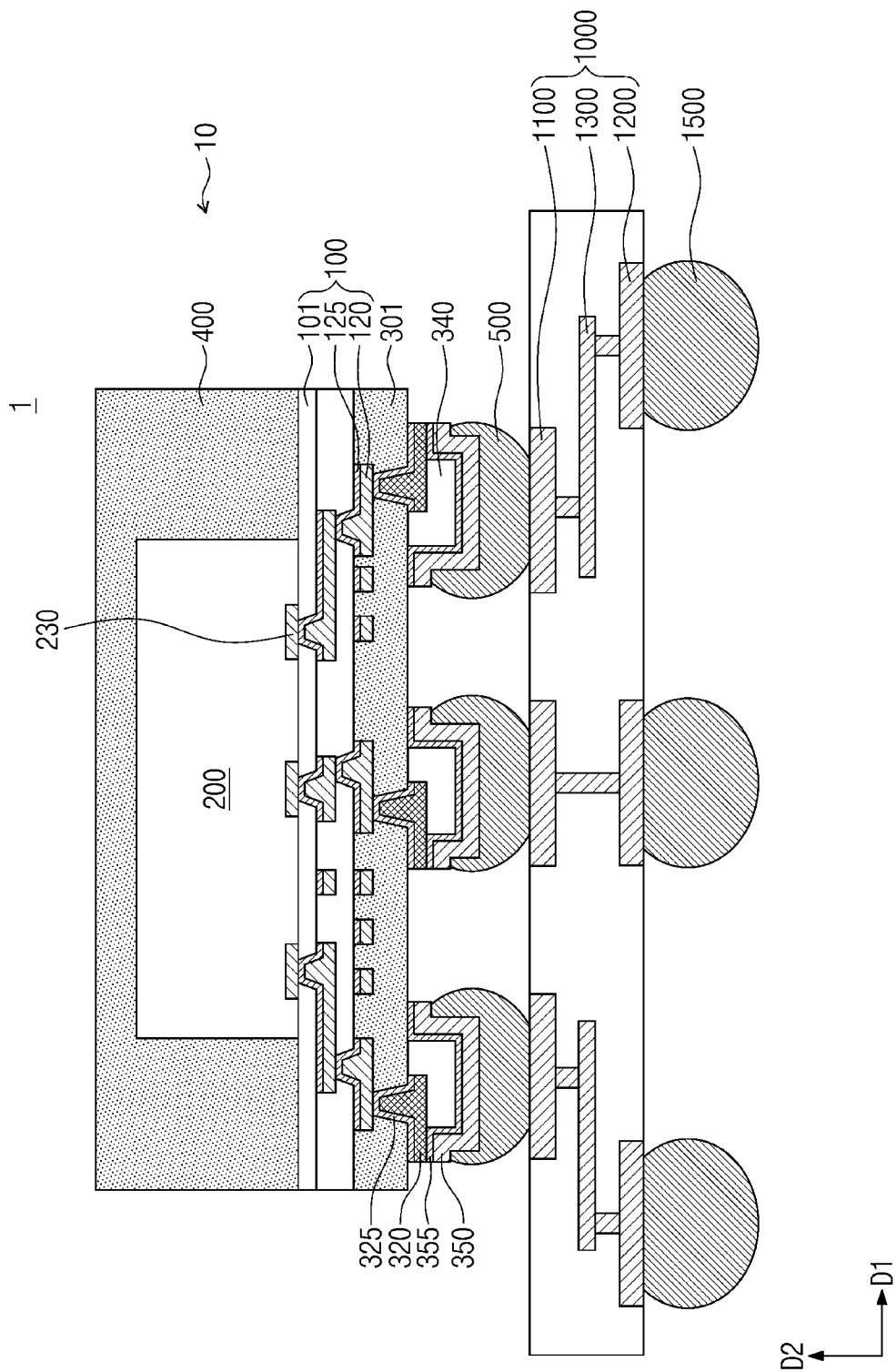
FIG. 5 illustrates a cross-sectional view showing a semiconductor module according to some embodiments.

FIG. 5 illustrates a cross-sectional view showing a semiconductor module according to some embodiments. A duplicate description will be omitted below.

Referring to FIG. 5, a semiconductor module 1 may include a board 1000 and a semiconductor package 10. A printed circuit board may be used as the board 1000. The board 1000 may include lower conductive pads 1200, upper conductive pads 1100, and internal lines 1300. The lower conductive pads 1200 and the upper conductive pads 1100 may be respectively provided on a bottom surface and a top surface of the board 1000. The board 1000 may be provided therein with the internal lines 1300 coupled to the upper conductive pads 1100 and the lower conductive pads 1200. The phrase "electrically connected to the board 1000" may mean "electrically connected to the internal lines 1300." The semiconductor module 1 may further include external solder balls 1500. The external solder balls 1500 may be provided on the lower conductive pads 1200. The upper conductive pads 1100 may be arranged at a relatively large pitch.

The semiconductor package 10 may be mounted on the board 1000. The semiconductor package 10 may be substantially the same as the semiconductor package 10 discussed in the example of FIG. 1A. Alternatively, the board 1000 may be mounted thereon with the semiconductor package 10A of FIG. 3, the semiconductor package 10B of FIG. 4A, or the semiconductor package 10C of FIG. 4B.

According to some embodiments, the semiconductor package 10 may be disposed on the board 1000 to cause solder balls 500 to align with the upper conductive pads 1100. A pitch of the solder balls 500 may be substantially the same as that of the upper conductive pads 1100. A soldering process may be performed such that the solder balls 500 may be coupled to the upper conductive pads 1100, and that the semiconductor package 10 may be electrically connected to the board 1000.

Within the semiconductor module 1, stress may occur due to a difference in thermal expansion coefficient between the board 1000 and the semiconductor package 10. As discussed above with respect to FIGS. 1A to 1D, the stress may be absorbed by the buffer pattern 340 and the protection layer 301. The stress may be alleviated by the under bump pattern 350, the buffer pattern 340, and the conductive pattern 320.

Figure 6A:
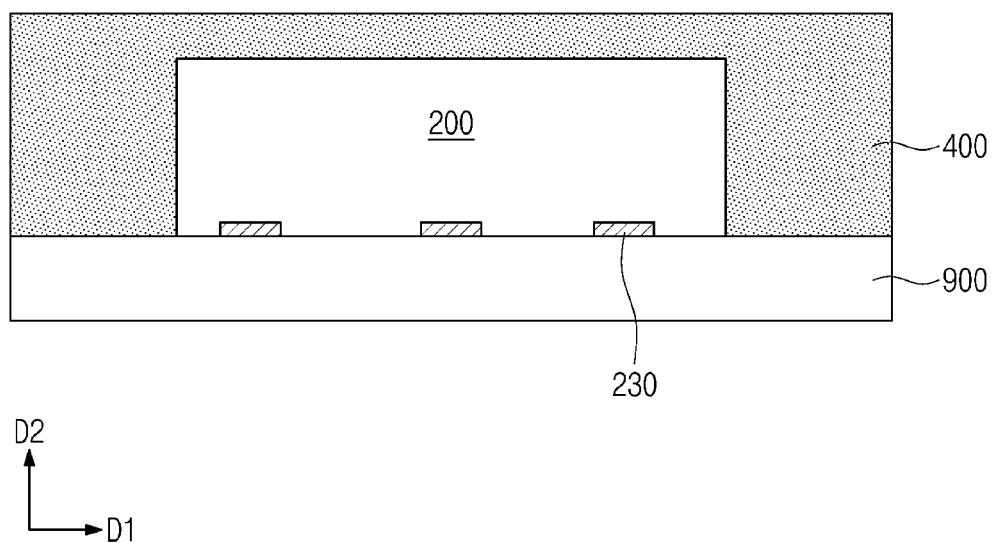
FIGS. 6A to 6O illustrate cross-sectional views showing a method of fabricating a semiconductor package according to some embodiments.

FIGS. 6A to 6O illustrate cross-sectional views showing a method of fabricating a semiconductor package according to some embodiments. A duplicate description will be omitted below. In describing FIGS. 6A to 6O, top and bottom surfaces of a certain component are discussed based on the relevant drawings.

Referring to FIG. 6A, a semiconductor chip 200 may be disposed on a carrier substrate 900. In this step, chip pads 230 of the semiconductor chip 200 may face the carrier substrate 900. A molding layer 400 may be formed on the carrier substrate 900 to cover the semiconductor chip 200. A bottom surface of the molding layer 400 may be located at substantially the same level as that of a bottom surface of the semiconductor chip 200.

Figure 6B:
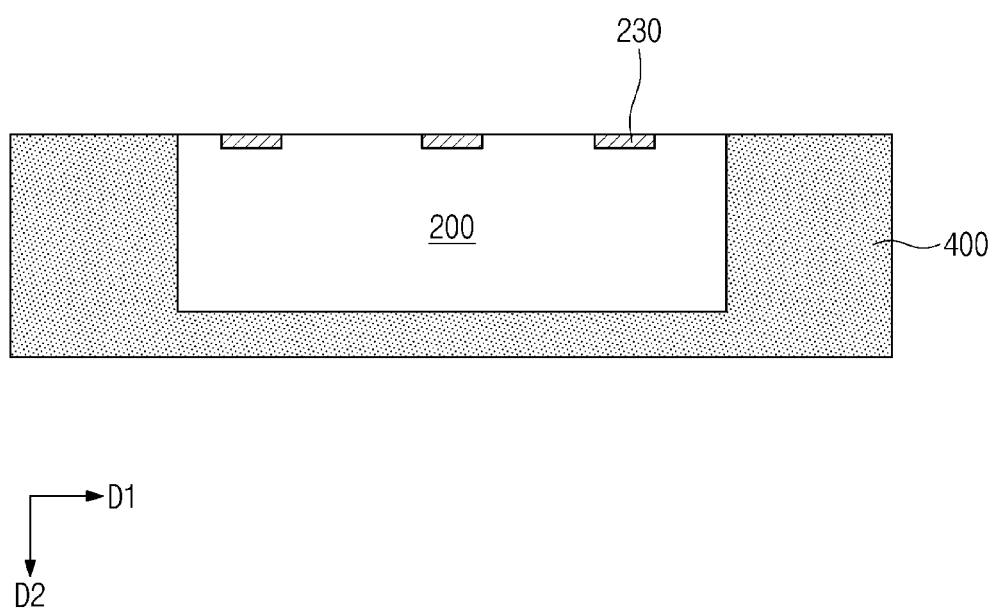

Referring to FIG. 6B, the carrier substrate 900, the semiconductor chip 200, and the molding layer 400 may be turned upside down. The carrier substrate 900 may be removed to expose a top surface of the semiconductor chip 200 and a top surface of the molding layer 400. Therefore, the chip pads 230 may be exposed.

Figure 6C:
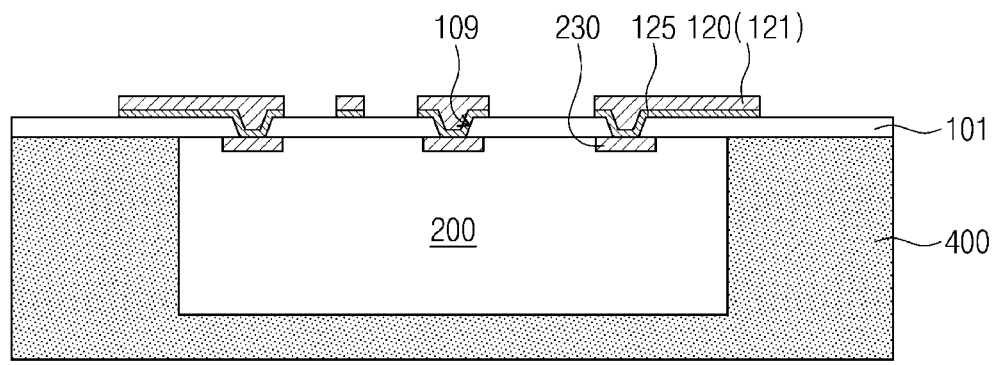

Referring to FIG. 6C, a first dielectric layer 101 may be formed on the semiconductor chip 200 and the molding layer 400, thereby covering the top surface of the molding layer 400 and the top surface of the semiconductor chip 200. For example, the formation of the first dielectric layer 101 may include coating a photosensitive polymer. A plurality of openings 109 may be formed in the first dielectric layer 101 to expose the chip pads 230. The formation of the openings 109 may be performed by a patterning process that includes an exposure process and a development process.

A plurality of first redistribution patterns 120 and a plurality of first seed patterns 125 may be formed in the openings 319 and on a top surface of the first dielectric layer 101. The first redistribution patterns 120 may be formed by performing an electroplating process in which the first seed patterns 125 are used as an electrode. The first redistribution patterns 120 may be first sub-redistribution patterns 121.

Figure 6D:
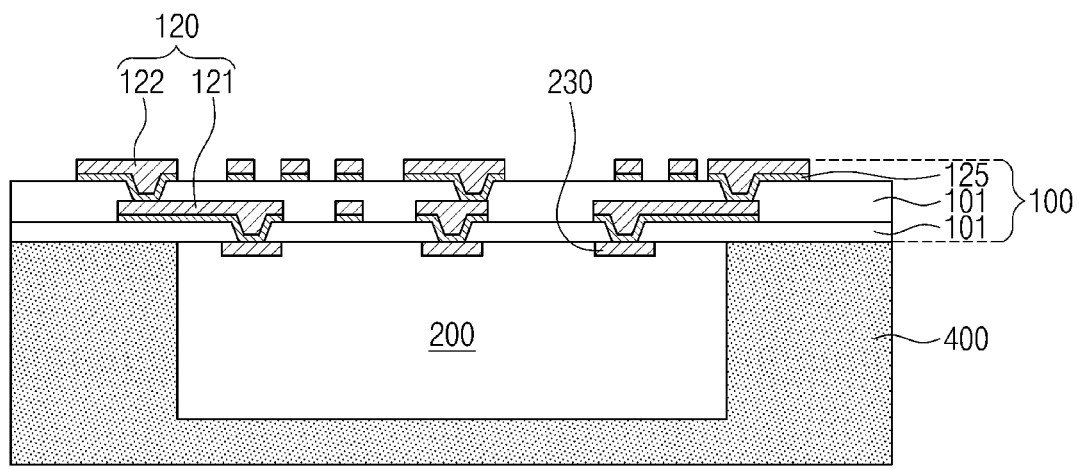

Referring to FIG. 6D, the formation of the first dielectric layer 101, the formation of the first seed patterns 125, and the formation of the first redistribution patterns 120 may be repeatedly performed to manufacture a first redistribution substrate 100. A chip-first process may be performed to manufacture the first redistribution substrate 100. The first redistribution substrate 100 may include the first dielectric layers 101, the first seed patterns 125, and the first redistribution patterns 120. Each of the first redistribution patterns 120 may include a first sub-redistribution pattern 121 and a second sub-redistribution pattern 122. The second sub-redistribution patterns 122 may be formed on the first sub-redistribution patterns 121.

Figure 6E:
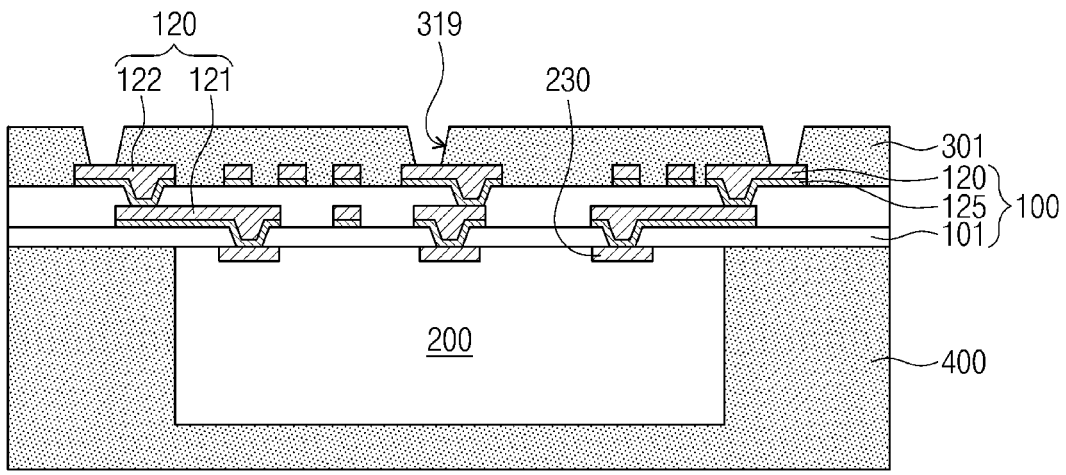

Referring to FIG. 6E, a protection layer 301 may be formed on a top surface of the first redistribution substrate 100 to cover the second sub-redistribution patterns 122. A plurality of openings 319 may be formed in the protection layer 301 to expose the second sub-redistribution patterns 122. The formation of the openings 319 may be achieved by, for example, a laser drilling process. Alternatively, a photolithography process may be performed to form the protection layer 301 and the openings 319. For example, the openings 319 may be formed by a patterning process that includes an exposure process and a development process.

Figure 6F:
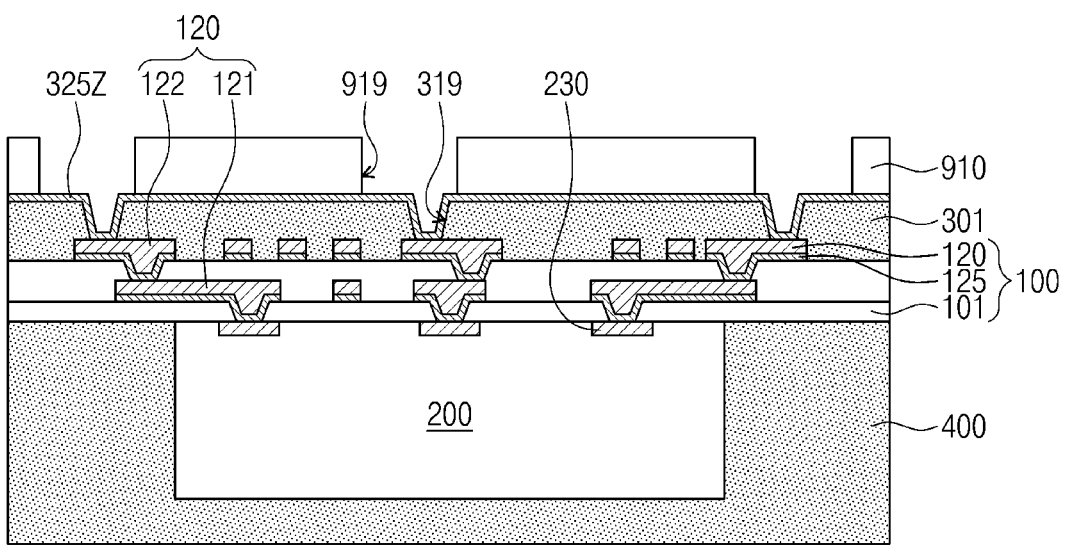

Referring to FIG. 6F, a conductive seed layer 325Z may be formed in the openings 319 and on the protection layer 301. The conductive seed layer 325Z may conformally cover, for example, bottom and side surfaces of the openings 319 and a top surface of the protection layer 301. For example, the formation of the conductive seed layer 325Z may be achieved by a deposition process such as sputtering. In this case, the conductive seed layer 325Z may include or may be formed of titanium or an alloy of titanium-copper. For another example, an electroless plating process may be performed to form the conductive seed layer 325Z. In this case, the conductive seed layer 325Z may include copper.

A first resist pattern 910 may be formed on the conductive seed layer 325Z. The first resist pattern 910 may include or may be formed of an organic material, such as a polymer. An exposure process and a development process may be performed such that first guide openings 919 may be formed in the first resist pattern 910. The first guide openings 919 may expose the conductive seed layer 325Z. The first guide openings 919 may be spatially connected to corresponding openings 319. The first guide openings 919 may have their widths greater than those of the openings 319.

Figure 6G:
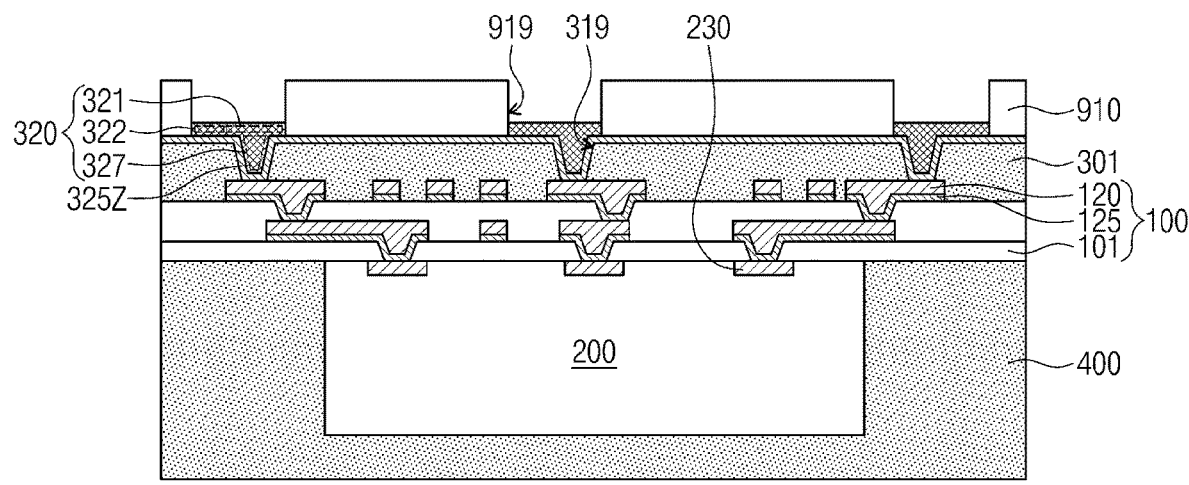

Referring to FIG. 6G, conductive patterns 320 may be formed in the openings 319 and the first guide openings 919, thereby covering the conductive seed layer 325Z. The conductive patterns 320 may be formed by performing an electroplating process in which the conductive seed layer 325Z is used as an electrode. The electroplating process may be terminated before the conductive patterns 320 extend onto a top surface of the first resist pattern 910. Therefore, no planarization process may be separately required to form the conductive patterns 320.

Each of the conductive patterns 320 may include a via part 327, a first line part 321, and a second line part 322. The via part 327 of each of the conductive patterns 320 may be provided in a corresponding opening 319. The first and second line parts 321 and 322 of each of the conductive patterns 320 may be provided in a corresponding first guide opening 919. As the widths of the first guide openings 919 are greater than those of the openings 319, it may be possible to easily form the via part 327, the first line part 321, and the second line part 322 of each of the conductive patterns 320.

Figure 6H:
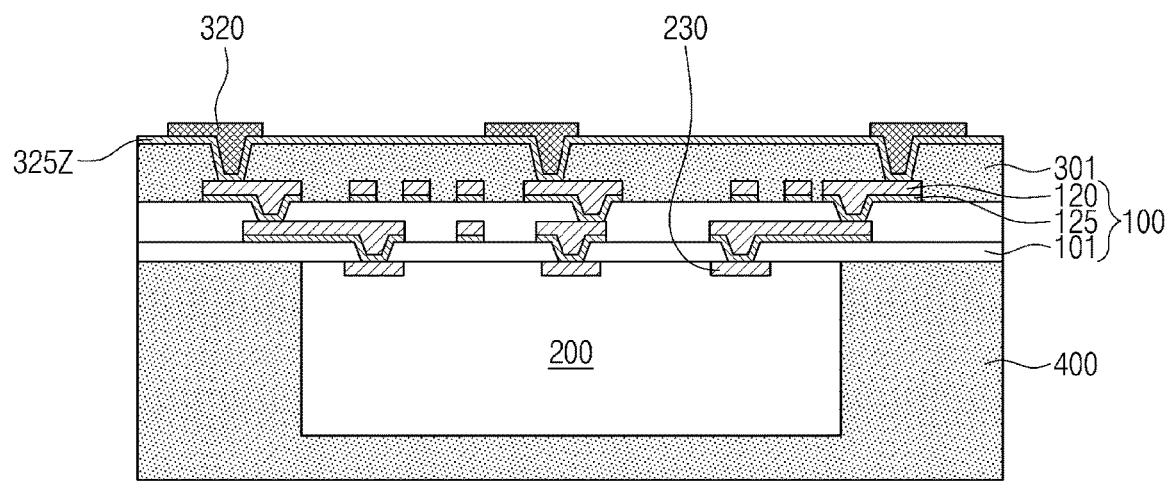

Referring to FIG. 6H, the first resist pattern 910 may be removed to expose first parts of the conductive seed layer 325Z. A strip process may be performed to remove the first resist pattern 910.

Figure 6I:
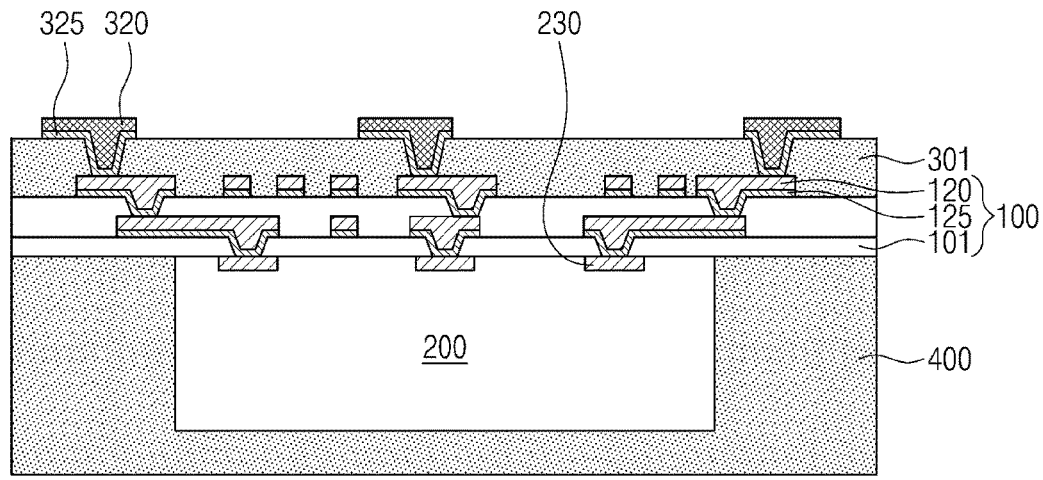

Referring to FIG. 6I, the exposed first parts of the conductive seed layer 325Z may be removed by an etching process to expose the protection layer 301. The conductive seed layer 325Z may have second parts that are correspondingly provided on bottom surfaces of the conductive patterns 320 and may not be exposed to the etching process. Therefore, the second parts of the conductive seed layer 325Z may not be removed. After the etching process, the remaining second parts of the conductive seed layer 325Z may be formed into conductive seed patterns 325. The conductive seed patterns 325 may be spaced apart and electrically separated from each other.

Figure 6J:
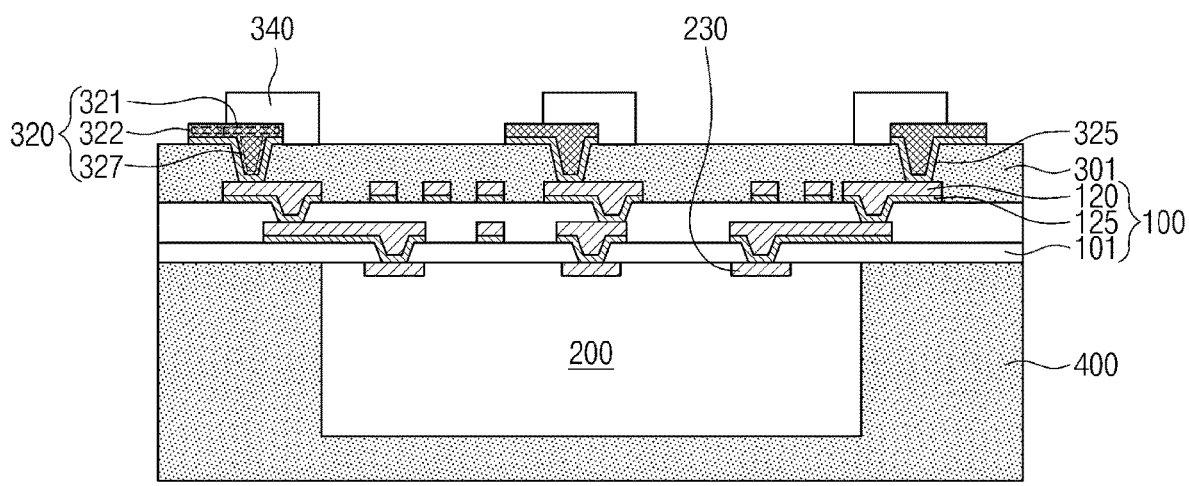

Referring to FIG. 6J, a plurality of buffer patterns 340 may be formed on corresponding conductive patterns 320.

Each of the buffer patterns 340 may be formed on and cover the protection layer 301 and the first line part 321 of the conductive pattern 320. The formation of the buffer patterns 340 may be achieved by a screen printing process, an inkjet printing process, or a dispensing process. Alternatively, the formation of the buffer patterns 340 may be achieved by a photolithography process. For example, the formation of the buffer pattern 340 may include coating a photosensitive material to form a preliminary layer and patterning the preliminary layer. The patterning of the preliminary layer may include performing exposure and development processes.

Figure 6K:
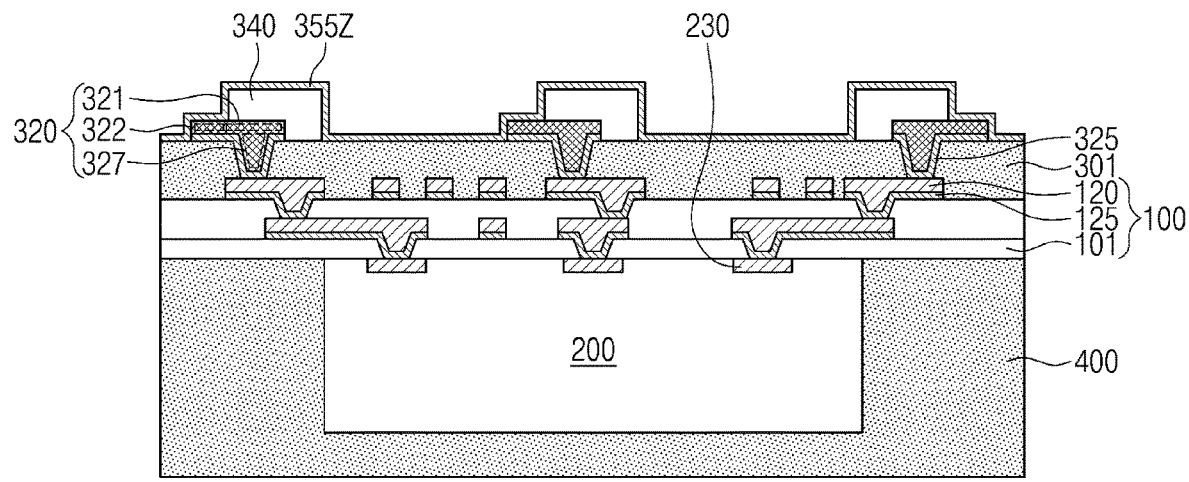

Referring to FIG. 6K, an under bump seed layer 355Z may be formed on the buffer patterns 340, the conductive patterns 320, and the protection layer 301. The under bump seed layer 355Z may conformally cover top and side surfaces of the second line part 322 of each conductive pattern 320, top and side surfaces of the buffer patterns 340, and the top surface of the protection layer 301. For example, the formation of the under bump seed layer 355Z may be achieved by a deposition process such as sputtering. In this case, the under bump seed layer 355Z may include titanium or an alloy of titanium-copper. For another example, the under bump seed layer 355Z may be achieved by an electroplating process. In this case, the under bump seed layer 355Z may include copper.

Figure 6L:
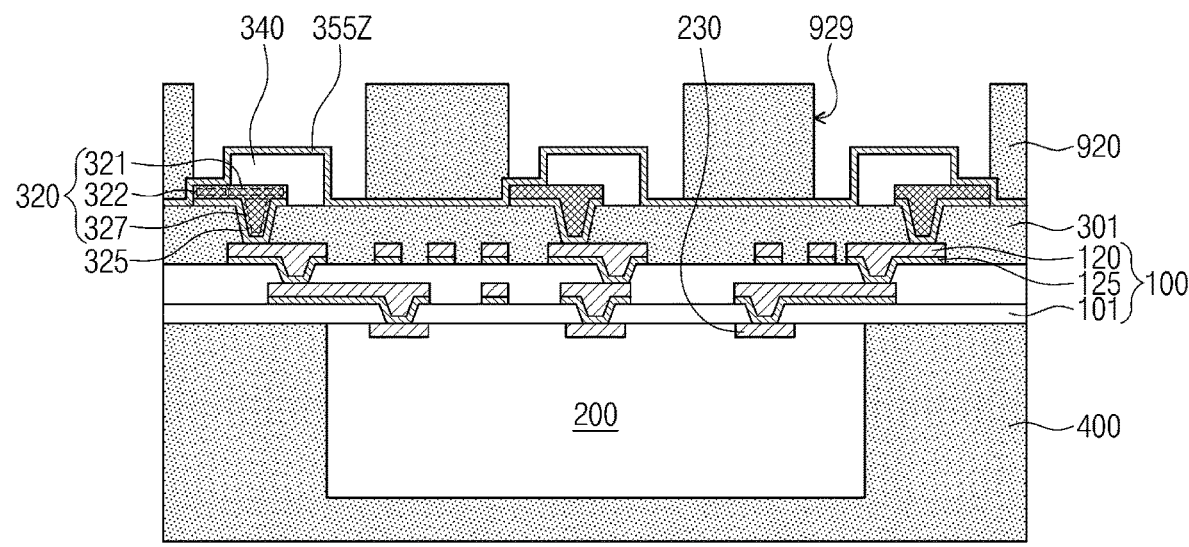

Referring to FIG. 6L, a second resist pattern 920 may be formed on the under bump seed layer 355Z. The second resist pattern 920 may include an organic material, such as a polymer. The second resist pattern 920 may be patterned to form second guide openings 929 in the second resist pattern 920. The second guide openings 929 may expose the under bump seed layer 355Z.

Figure 6M:
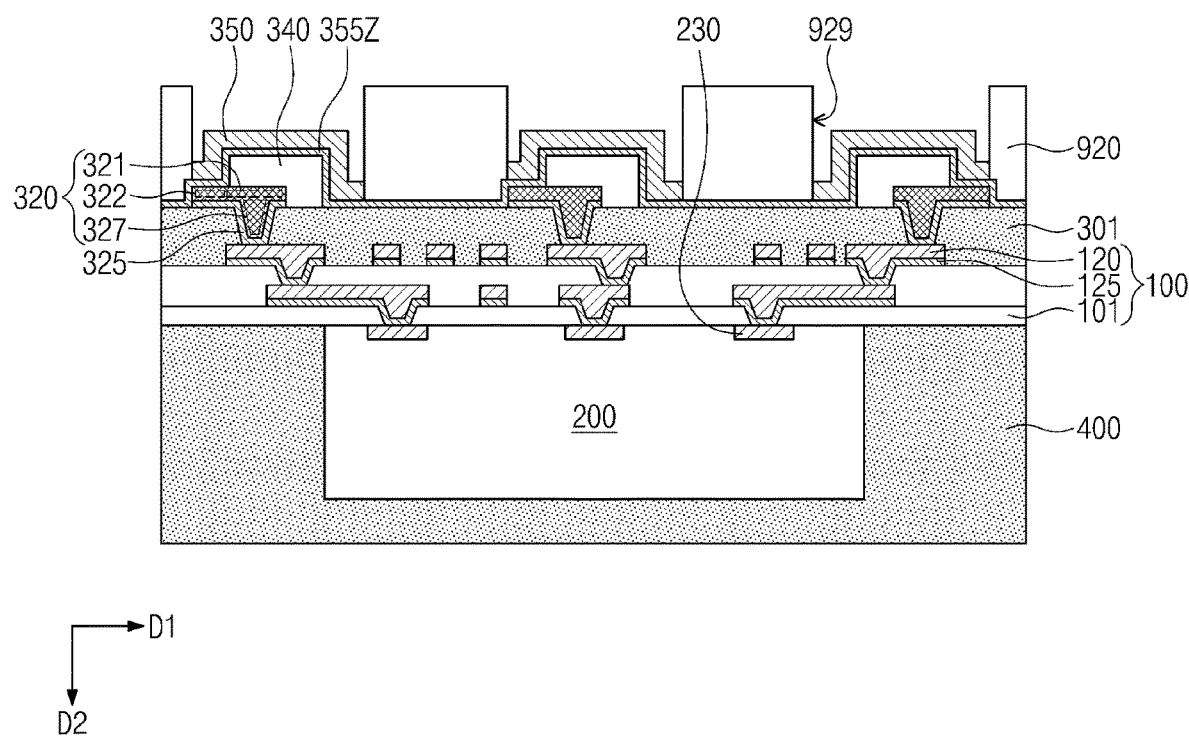

Referring to FIG. 6M, under bump patterns 350 may be correspondingly formed in the second guide openings 929 to cover the under bump seed layer 355Z. For example, each of the under bump patterns 350 may be provided on the top and side surfaces of a corresponding buffer pattern 340 and on the top surface of the second line part 322 of a corresponding conductive pattern 320. The under bump patterns 350 may extend onto the top surface of the protection layer 301. The under bump patterns 350 may be formed by performing an electroplating process in which the under bump seed layer 355Z is used as an electrode. The electroplating process may be terminated before the under bump patterns 350 extend onto a top surface of the second resist pattern 920. Therefore, no planarization process may be separately required in forming the under bump patterns 350. The under bump patterns 350 may be laterally spaced apart from each other. The under bump patterns 350 may have a step difference.

Figure 6N:
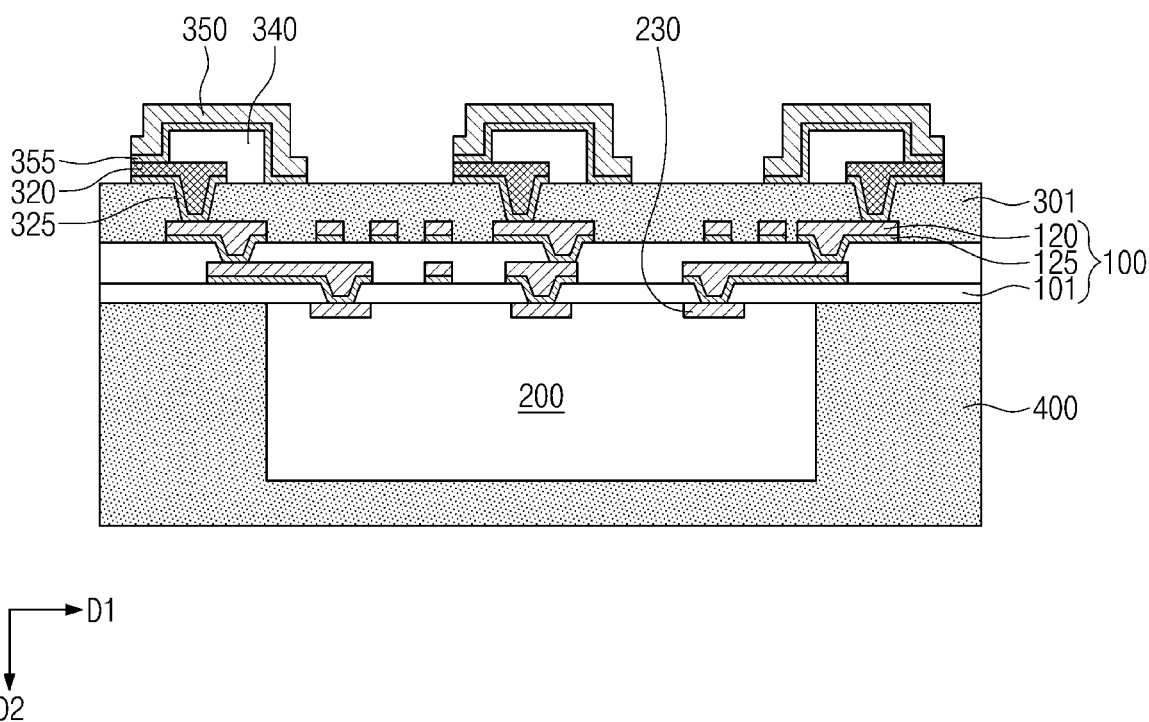
Figure 60:
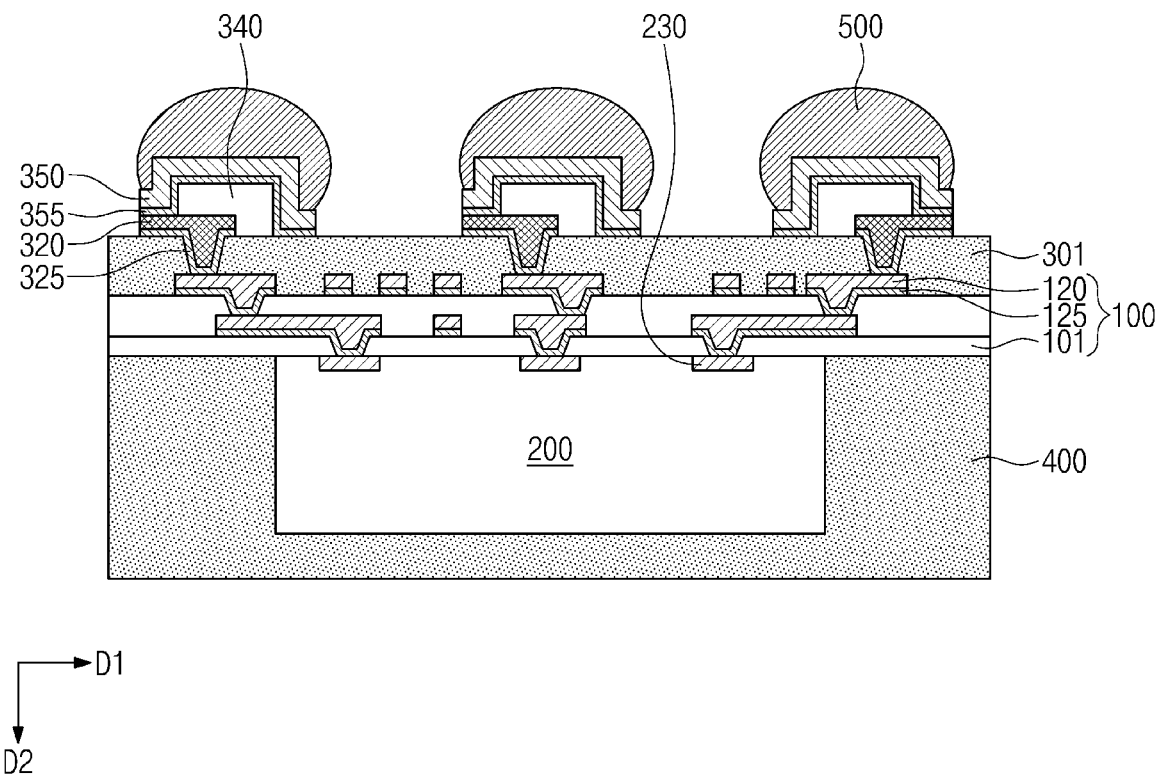

Referring to FIG. 6N, the second resist pattern 920 may be removed to expose first parts of the under bump seed layer 355Z. The exposed first parts of the under bump seed layer 355Z may be removed by an etching process to expose the protection layer 301. The under bump seed layer 355Z may have second parts that are correspondingly provided on bottom surfaces of the under bump patterns 350 and may not be exposed to the etching process. Therefore, the second parts of the under bump seed layer 355Z may not be removed. After the etching process, the remaining second parts of the under bump seed layer 355Z may be formed into under bump seed patterns 355. The under bump seed patterns 355 may be spaced apart and electrically separated from each other.

Referring to FIG. 6O, solder balls 500 may be correspondingly formed on the under bump patterns 350. As the under bump patterns 350 have a step difference, the solder balls 500 may be rigidly bonded to the under bump patterns 350.

Referring back to FIG. 1A, the semiconductor chip 200, the molding layer 400, and the first redistribution substrate 100 may be turned upside down to allow the solder balls 500 to face downward. Accordingly, a semiconductor package 10 may thus be eventually fabricated.

According to the present inventive concepts, a buffer pattern may be in physical contact with a protection layer and with a first line part of a conductive pattern. An under bump pattern may cover the buffer pattern and a second line part of the conductive pattern and may have electrical connection with the second line part. As the buffer pattern and the conductive pattern are provided, the occurrence of a crack may be prevented between the under bump pattern and a solder ball and between the under bump pattern and the conductive pattern. A semiconductor package may have increased reliability and improved durability.

The conductive pattern may be provided on a redistribution pattern. As the conductive pattern is provided, the redistribution pattern may be less limited in terms of arrangement, width, and/or number.

This detailed description of the present inventive concepts should not be construed as limited to the embodiments set forth herein, and it is intended that the present inventive concepts cover the various combinations, the modifications and variations of this invention without departing from the spirit and scope of the present inventive concepts.

What is claimed is:

1. A semiconductor package, comprising:
a semiconductor chip;
a redistribution pattern on a bottom surface of the semiconductor chip and coupled to the semiconductor chip;
a protection layer that covers a bottom surface of the redistribution pattern;
a conductive pattern on a bottom surface of the protection layer and coupled to the redistribution pattern;
a buffer pattern in contact with a bottom surface of a first part of the conductive pattern and with the bottom surface of the protection layer, the buffer pattern being spaced apart from a second part of the conductive pattern; and
an under bump pattern on a bottom surface of the second part of the conductive pattern, the under bump pattern covering a bottom surface and a side surface of the buffer pattern,
wherein the under bump pattern is coupled to the second part of the conductive pattern.

2. The semiconductor package of claim 1, wherein the under bump pattern includes:
a first bottom surface on the bottom surface of the buffer pattern;
a second bottom surface on the second part of the conductive pattern; and
a third bottom surface on the bottom surface of the protection layer,
wherein, in a first direction perpendicular to the bottom surface of the protection layer, the second bottom surface is at a level different from a level of the first bottom surface, and
wherein, in the first direction, the third bottom surface is at a level different from the level of the first bottom surface.

3. The semiconductor package of claim 2, further comprising a solder ball on the under bump pattern, wherein the solder ball covers the first bottom surface, the second bottom surface, and the third bottom surface of the under bump pattern.

4. The semiconductor package of claim 1, further comprising a dielectric layer between the semiconductor chip and the redistribution pattern,
wherein the buffer pattern has an elongation the same as or greater than an elongation of the dielectric layer.

5. The semiconductor package of claim 1, further comprising a dielectric layer between the semiconductor chip and the redistribution pattern,
wherein the protection layer has an elongation greater than an elongation of the dielectric layer.

6. The semiconductor package of claim 1, wherein the conductive pattern further includes a via part in the protection layer,
wherein the first part of the conductive pattern is below the via part, and
wherein the second part of the conductive pattern is on the bottom surface of the protection layer and is connected to the first part of the conductive pattern.

7. The semiconductor package of claim 1, further comprising an under bump seed pattern between the under bump pattern and the buffer pattern and between the under bump pattern and the second part of the conductive pattern.

8. The semiconductor package of claim 1, wherein a height of the buffer pattern is in a range of about 5 μm to about 50 μm.

9. The semiconductor package of claim 1, wherein a width in a first direction parallel to the bottom surface of the protection layer, of the under bump pattern is greater than a width, in the first direction, of the buffer pattern.

10. The semiconductor package of claim 1, wherein
a portion of the under bump pattern extends onto the protection layer, and
neither the conductive pattern nor the buffer pattern is between the protection layer and the portion of the under bump pattern.

11. A semiconductor package, comprising:
a semiconductor chip that includes a chip pad;
a redistribution pattern on the semiconductor chip and coupled to the chip pad;
a protection layer on the semiconductor chip and covering the redistribution pattern;
a conductive pattern on the protection layer and coupled to the redistribution pattern;
a buffer pattern that includes a first top surface in contact with the protection layer and a second top surface in contact with a first part of the conductive pattern; and
an under bump pattern that covers the buffer pattern and a second part of the conductive pattern.

12. The semiconductor package of claim 11, wherein
the buffer pattern is spaced apart from the second part of the conductive pattern, and
the under bump pattern is electrically connected to the second part of the conductive pattern.

13. The semiconductor package of claim 11, wherein the under bump pattern covers a bottom surface and a side surface of the buffer pattern,
wherein the second top surface of the buffer pattern is at a level, in a first direction perpendicular to the bottom surface of the buffer pattern, different from a level, in the first direction, of the first top surface.

14. The semiconductor package of claim 11, further comprising a solder ball on a first bottom surface and a second bottom surface of the under bump pattern, wherein the first bottom surface of the under bump pattern is on a bottom surface of the buffer pattern, wherein the second bottom surface of the under bump pattern is on the second part of the conductive pattern, and wherein, in a first direction perpendicular to the first bottom surface of the buffer pattern, the second bottom surface is at a level different from a level of the first bottom surface.

15. The semiconductor package of claim 11, further comprising:
    a conductive seed pattern between the conductive pattern and the redistribution pattern and between the conductive pattern and the protection layer; and
    an under bump seed pattern between the under bump pattern and the buffer pattern and between the under bump pattern and the second part of the conductive pattern.

16. A semiconductor package, comprising:
    a semiconductor chip that includes a chip pad;
    a redistribution substrate on a bottom surface of the semiconductor chip and including a dielectric layer, a seed pattern, and a redistribution pattern, the redistribution substrate being electrically connected to the chip pad;
    a protection layer that covers a bottom surface of the redistribution pattern;
    a conductive pattern on a bottom surface of the protection layer and electrically connected to the redistribution pattern, the conductive pattern including
    a via part on the bottom surface of the redistribution pattern and in the protection layer,
    a first line part on a bottom surface of the via part, and
    a second line part on the bottom surface of the protection layer and connected to the first line part;
    a dielectric buffer pattern in contact with the first line part of the conductive pattern and with the protection layer, the dielectric buffer pattern being spaced apart from the second line part of the conductive pattern;
    an under bump pattern that covers a bottom surface of the second line part of the conductive pattern, a bottom surface and a side surface of the dielectric buffer pattern, and the bottom surface of the protection layer; and
    a solder ball on a bottom surface of the under bump pattern,
    wherein the under bump pattern is coupled to the second line part of the conductive pattern.

17. The semiconductor package of claim 16, wherein the under bump pattern includes:
    a first bottom surface on the bottom surface of the dielectric buffer pattern;
    a second bottom surface on the bottom surface of the second line part of the conductive pattern; and
    a third bottom surface on the bottom surface of the protection layer,
    wherein, in a first direction perpendicular to the bottom surface of the protection layer, the second bottom surface is at a level different from a level of the first bottom surface, and
    wherein, in the first direction, the third bottom surface is at a level different from the level of the first bottom surface and the level of the second bottom surface.

18. The semiconductor package of claim 16, wherein
    the buffer dielectric pattern has an elongation greater than an elongation of the dielectric layer, and
    the protection layer has an elongation greater than the elongation of the dielectric layer.

19. The semiconductor package of claim 16, wherein
    an interval between an outer wall of the under bump pattern and the side surface of the dielectric buffer pattern is in a range of about 10 μm to about 120 μm, and
    the side surface of the dielectric buffer pattern is directed toward the outer wall of the under bump pattern.

20. The semiconductor package of claim 16, further comprising a molding layer on a top surface of the redistribution substrate and covering the semiconductor chip.

* * * * *